US010049976B2

(12) United States Patent
Chen et al.

(10) Patent No.: US 10,049,976 B2
(45) Date of Patent: Aug. 14, 2018

(54) SEMICONDUCTOR SUBSTRATE AND MANUFACTURING METHOD THEREOF

(71) Applicant: Advanced Semiconductor Engineering, Inc., Kaohsiung (TW)

(72) Inventors: Tien-Szu Chen, Kaohsiung (TW); Chun-Che Lee, Kaohsiung (TW); Sheng-Ming Wang, Kaohsiung (TW); Kuang-Hsiung Chen, Kaohsiung (TW); Yu-Ying Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/006,306

(22) Filed: Jan. 26, 2016

(65) Prior Publication Data

US 2016/0225708 A1 Aug. 4, 2016

(30) Foreign Application Priority Data

Jan. 30, 2015 (CN) .......................... 2015 1 0050087

(51) Int. Cl.
*H01L 23/498* (2006.01)
*H01L 21/48* (2006.01)

(52) U.S. Cl.
CPC ...... *H01L 23/49838* (2013.01); *H01L 21/486* (2013.01); *H01L 21/4846* (2013.01); *H01L 21/4857* (2013.01); *H01L 23/49822* (2013.01); *H01L 23/49827* (2013.01); *H01L 23/49894* (2013.01); *H01L 2224/48091* (2013.01); *H01L 2224/48227* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| 2008/0182400 | A1 | 7/2008 | Machida et al. |
| 2015/0001708 | A1 | 1/2015 | Lin |
| 2016/0225708 | A1* | 8/2016 | Chen ................. H01L 23/49822 |

FOREIGN PATENT DOCUMENTS

| CN | 203288579 U | 11/2013 |
| CN | 104253105 A | 12/2014 |

OTHER PUBLICATIONS

Office Action and Search Report for corresponding Chinese Patent Application No. 201510050087.8, dated Feb. 2, 2018, 6 pages.

* cited by examiner

*Primary Examiner* — Long Pham
(74) *Attorney, Agent, or Firm* — Foley & Lardner LLP; Cliff Z. Liu

(57) ABSTRACT

A semiconductor substrate includes an insulating layer and a conductive circuit layer embedded at a surface of the insulating layer. The conductive circuit layer includes a first portion and a second portion. The first portion includes a bonding pad and one portion of a conductive trace, and the second portion includes another portion of the conductive trace. An upper surface of the first portion is not coplanar with an upper surface of the second portion. A semiconductor packaging structure includes the semiconductor substrate.

20 Claims, 27 Drawing Sheets

SEMICONDUCTOR SUBSTRATE AND MANUFACTURING METHOD THEREOF

CROSS-REFERENCE TO RELATED PATENT APPLICATIONS

This application claims the benefit of P.R.C. (China) Patent Application No. 201510050087.8 filed on 30 Jan. 2015, the contents of which are incorporated herein by reference in their entirety.

BACKGROUND

1. Field

The present disclosure relates to a semiconductor substrate and a manufacturing method thereof, and a semiconductor packaging structure including the substrate. Particularly, the present disclosure relates to a semiconductor substrate without electroplating line design and a manufacturing method thereof.

2. Description of the Related Art

In a conventional embedded circuit substrate, a conductive circuit layer is located on a surface of the substrate and is exposed at the surface of the substrate, where the conductive circuit layer may include multiple bonding pads and conductive traces. A semiconductor chip is disposed on the substrate, and the chip electrically connects to the bonding pads and the conductive traces through bonding wires. Generally, to effectively keep the bonding wires connected onto the bonding pads, a surface treatment layer is plated on the bonding pads. Electroplating lines are thus included in the circuit layout design, and the electroplating lines may connect the bonding pads and the conductive traces onto a holder of the substrate, to form the surface treatment layer on the bonding pads by electroplating. However, the electroplating lines increase trace pitch, which is contrary to a demand for size reduction of electronic products.

SUMMARY

The present disclosure provides a semiconductor substrate and a manufacturing method thereof, the semiconductor substrate has an embedded circuit without electroplating line design, so as to provide for finer pitch, and thereby increase flexibility of circuit layout and reduce manufacturing cost.

In an aspect, a semiconductor substrate includes an insulating layer and a conductive circuit layer embedded at a surface of the insulating layer. The conductive circuit layer includes a first portion and a second portion. The first portion includes a bonding pad and one portion of a conductive trace, and the second portion includes another portion of the conductive trace. An upper surface of the first portion is not coplanar with an upper surface of the second portion.

In an aspect, a semiconductor packaging structure includes a substrate, a die, and an encapsulant. The substrate includes an insulating layer and a conductive circuit layer adjacent to a surface of the insulating layer. The conductive circuit layer includes a first portion and a second portion, and the first portion includes a bonding pad. A surface of the first portion is displaced relative to a surface of the second portion. The die electrically connects to the bonding pad. The encapsulant covers the die and the bonding pad.

In an aspect, a manufacturing method of a semiconductor substrate includes: (a) providing a substrate including a conductive layer, a conductive circuit layer disposed on the conductive layer, and an insulating layer disposed on the conductive layer and the conductive circuit layer, where the conductive circuit layer includes a first portion and a second portion, and the first portion includes a bonding pad; (b) removing a portion of the conductive layer to expose the first portion of the conductive circuit layer; (c) forming a surface treatment layer on the first portion by electroplating; and (d) removing a remainder of the conductive layer.

Other aspects and embodiments of the present disclosure are also covered. The foregoing summary and the following description are not intended to limit the present disclosure to any particular embodiment, but are only intended to describe some embodiments of the present disclosure.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

The present disclosure relates to a semiconductor substrate and a manufacturing method thereof, and a semiconductor packaging structure including the substrate; in particular, the present disclosure relates to a semiconductor substrate without electroplating line design and a manufacturing method thereof.

Figure 1A:
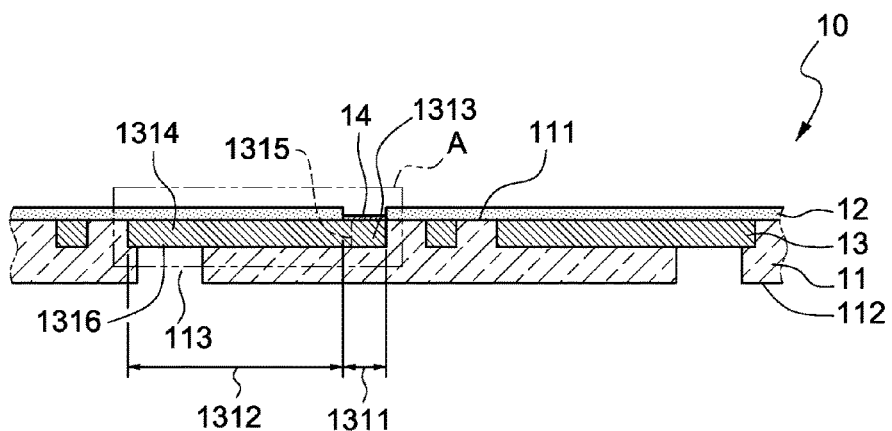
FIG. 1A is an illustration of a semiconductor substrate according to an embodiment of the present disclosure.

FIG. 1A illustrates a semiconductor substrate 10 according to an embodiment of the present disclosure. FIGS. 1B-1F are enlarged views of a section 'A' shown in dotted line in FIG. 1A. Referring to FIG. 1A, an insulating layer 11 includes a first surface 111 and a second surface 112. A first conductive circuit layer 13 adjacent to the first surface 111 of the insulating layer 11 includes a first portion 1311 and a second portion 1312. Above the first portion 1311 is a surface treatment layer 14. Optionally, a solder resist layer 12 can be formed on the first surface 111, to cover the first conductive circuit layer 13 and the insulating layer 11. The solder resist layer 12 may include (but is not limited to) a solder mask, benzocyclobutene (BCB) or a polyimide (PI). The first conductive circuit layer 13 includes a bonding pad 1313, a conductive trace 1314 and a solder pad 1316. The first portion 1311 of the first conductive circuit layer 13 includes the bonding pad 1313 and a part of the conductive trace 1314 (a virtual line 1315 is a separation line between them), the second portion 1312 includes a remainder of the conductive trace 1314 and the solder pad 1316. The second surface 112 of the insulating layer 11 defines an opening 113 to expose the solder pad 1316.

Figure 1B:
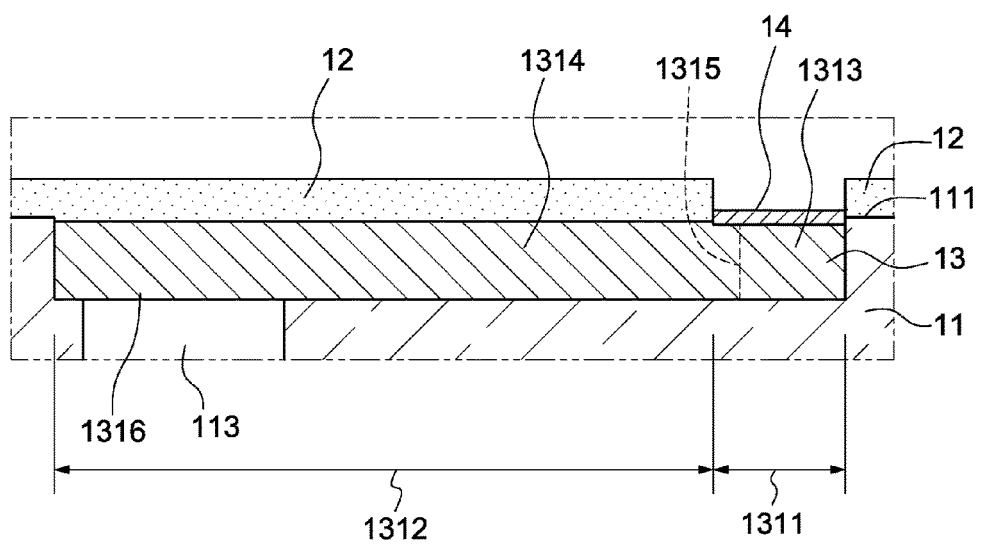
FIG. 1B, FIG. 1C, FIG. 1D, FIG. 1E and FIG. 1F are enlargements of a section 'A' of FIG. 1A according to embodiments of the present disclosure.

FIG. 1B illustrates an embodiment of the present disclosure in which an upper surface of the surface treatment layer 14 is higher than the first surface 111 of the insulating layer 11, higher than an upper surface of the second portion 1312 of the first conductive circuit layer 13, and lower than an upper surface of the solder resist layer 12; the upper surface of the second portion 1312 is higher than an upper surface of the first portion 1311, and the upper surface of the first portion 1311 is lower than the first surface 111 of the insulating layer 11 and lower than the upper surface of the solder resist layer 12.

Figure 1C:
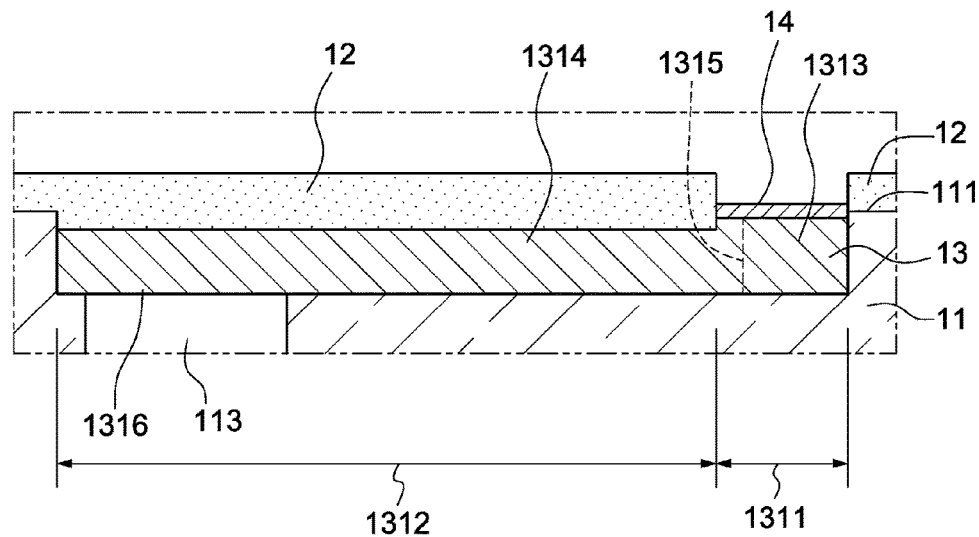

FIG. 1C illustrates an embodiment of the present disclosure in which the upper surface of the surface treatment layer 14 is higher than the first surface 111 of the insulating layer 11, higher than the upper surface of the second portion 1312 of the first conductive circuit layer 13, and lower than the upper surface of the solder resist layer 12; the upper surface of the second portion 1312 is lower than the upper surface of the first portion 1311, and the upper surface of the first portion 1311 is lower than the first surface 111 of the insulating layer 11 and lower than the upper surface of the solder resist layer 12.

Figure 1D:
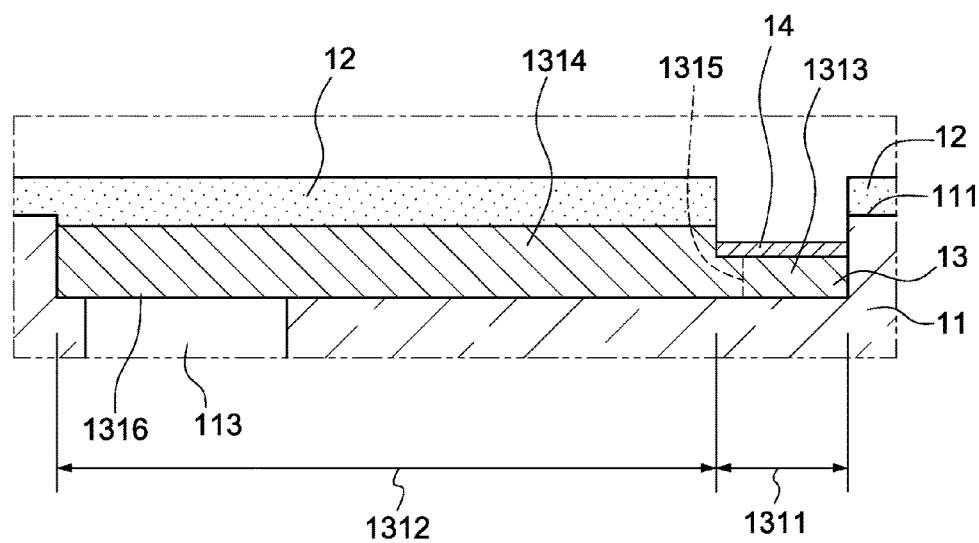

FIG. 1D illustrates an embodiment of the present disclosure in which the upper surface of the surface treatment layer 14 is lower than the first surface 111 of the insulating layer 11, lower than the upper surface of the second portion 1312 of the first conductive circuit layer 13, and lower than the upper surface of the solder resist layer 12; the upper surface of the second portion 1312 is higher than the upper surface of the first portion 1311, and the upper surface of the first portion 1311 is lower than the first surface 111 of the insulating layer 11 and lower than the upper surface of the solder resist layer 12.

Figure 1E:
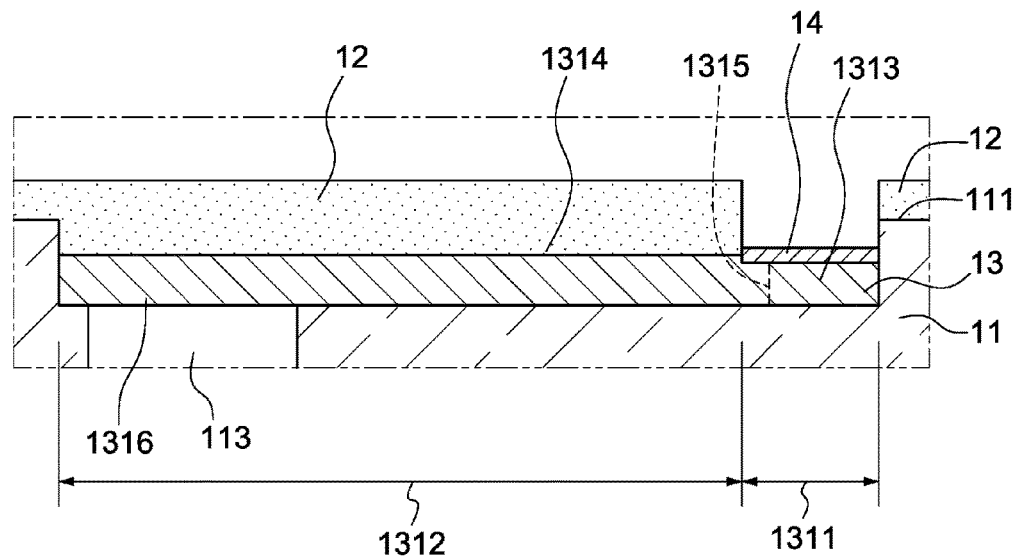

FIG. 1E illustrates an embodiment of the present disclosure in which the upper surface of the surface treatment layer 14 is lower than the first surface 111 of the insulating layer 11, higher than the upper surface of the second portion 1312 of the first conductive circuit layer 13, and lower than the upper surface of the solder resist layer 12; the upper surface of the second portion 1312 is higher than the upper surface of the first portion 1311, and the upper surface of the first portion 1311 is lower than the first surface 111 of the insulating layer 11 and lower than the upper surface of the solder resist layer 12.

Figure 1F:
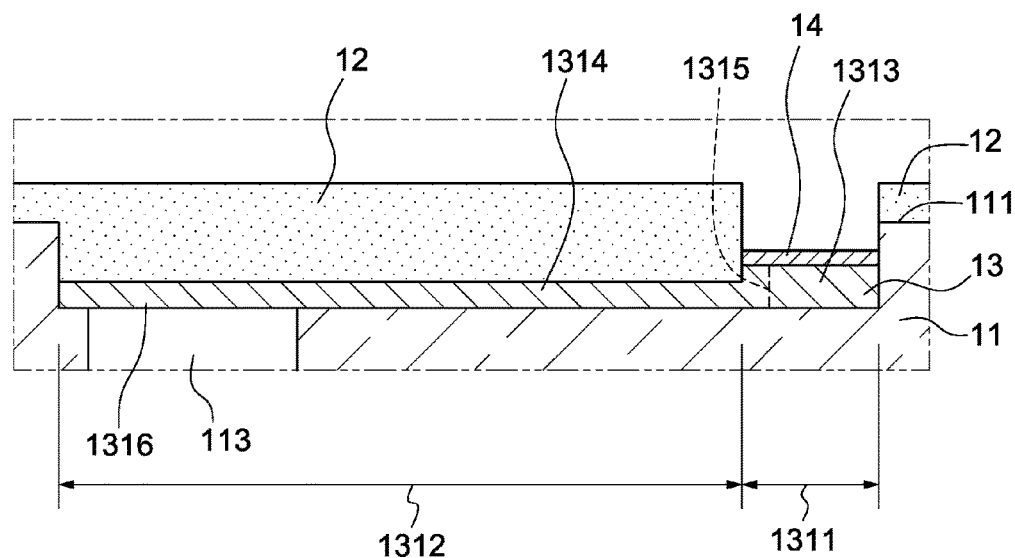

FIG. 1F illustrates an embodiment of the present disclosure in which the upper surface of the surface treatment layer 14 is lower than the first surface 111 of the insulating layer 11, higher than the upper surface of the second portion 1312 of the first conductive circuit layer 13, and lower than the upper surface of the solder resist layer 12; the upper surface of the second portion 1312 is lower than the upper surface of the first portion 1311, and the upper surface of the first portion 1311 is lower than the first surface 111 of the insulating layer 11 and lower than the upper surface of the solder resist layer 12.

As can be seen for the embodiments of FIGS. 1B-1F, the upper surface of the first portion 1311 of the first conductive circuit layer 13 is not coplanar with, or is displaced relative to, the upper surface of the second portion 1312 of the first conductive circuit layer 13.

As can also be seen for the embodiments of FIGS. 1B-1F, the upper surface of the second portion 1312 of the first conductive circuit layer 13 and the upper surface of the first portion 1311 of the first conductive circuit layer 13 are each lower than the first surface 111 of the insulating layer 11.

Figure 1G:
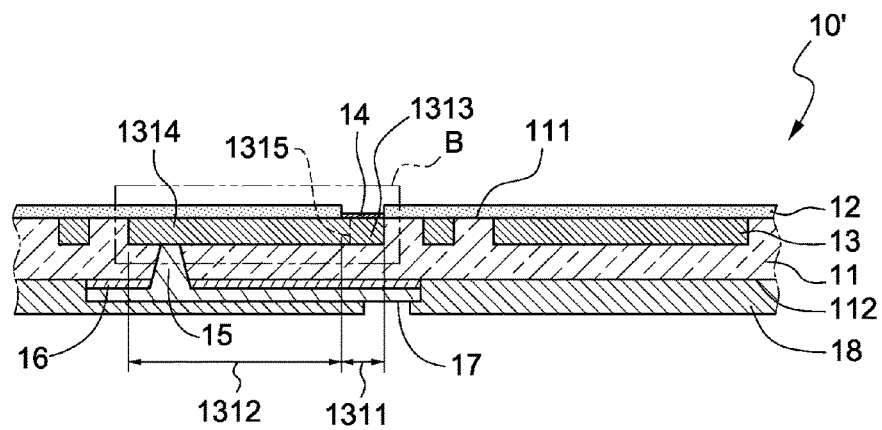
FIG. 1G is an illustration of a semiconductor substrate according to an embodiment of the present disclosure.

FIG. 1G illustrates a semiconductor substrate 10' according to an embodiment of the present disclosure. FIGS. 1H-1L are enlarged views of a section 'B' shown in dotted line in FIG. 1G. Referring to FIG. 1G, the semiconductor substrate 10' includes an insulating layer 11, a first conductive circuit layer 13, a second conductive circuit layer 16 and a conductive via 15. The insulating layer 11 has a first surface 111 and a second surface 112. The first conductive circuit layer 13 is adjacent to the first surface 111 of the insulating layer 11. The first conductive circuit layer 13 includes a first portion 1311 and a second portion 1312. Above the first portion 1311 is a surface treatment layer 14.

The conductive via 15 electrically connects to the first conductive circuit layer 13 and to the second conductive circuit layer 16. Optionally, a solder resist layer 12 may be disposed on the first surface 111 of the insulating layer 11 to cover the insulating layer 11 and the first conductive circuit layer 13. Optionally, a solder resist layer 18 may be disposed on the second surface 112 of the insulating layer 11 to cover the insulating layer 11 and the second conductive circuit layer 16. The solder resist layers 12 and 18 may include (but are not limited to) a solder mask, BCB or a PI.

The first conductive circuit layer 13 includes a conductive trace 1314. The first portion 1311 of the first conductive circuit layer 13 includes a bonding pad 1313 and a part of the conductive trace 1314 (a virtual line 1315 is a separation line that separates the bonding pad 1313 from the conductive trace 1314). The second portion 1312 includes a remainder of the conductive trace 1314. The second conductive circuit layer 16 includes a solder pad 17, and the solder resist layer 18 defines an opening to expose the solder pad 17.

Figure 1H:
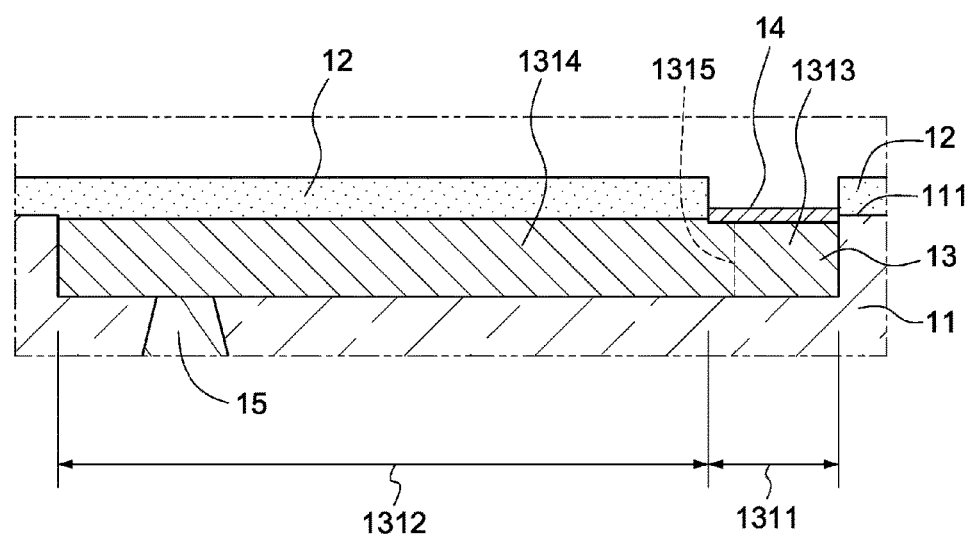
FIG. 1H, FIG. 1I, FIG. 1J, FIG. 1K and FIG. 1L are enlargements of a section 'B' of FIG. 1G according to embodiments of the present disclosure.

FIG. 1H illustrates an embodiment of the present disclosure, and compared with FIG. 1B, the structure illustrated in FIG. 1H includes a conductive via 15. In FIG. 1H, an upper surface of the surface treatment layer 14 is higher than the first surface 111 of the insulating layer 11, higher than an upper surface of the second portion 1312 of the first conductive circuit layer 13, and lower than an upper surface of the solder resist layer 12; the upper surface of the second portion 1312 is higher than an upper surface of the first portion 1311, and the upper surface of the first portion 1311 is lower than the first surface 111 of the insulating layer 11 and lower than the upper surface of the solder resist layer 12.

Figure 1I:
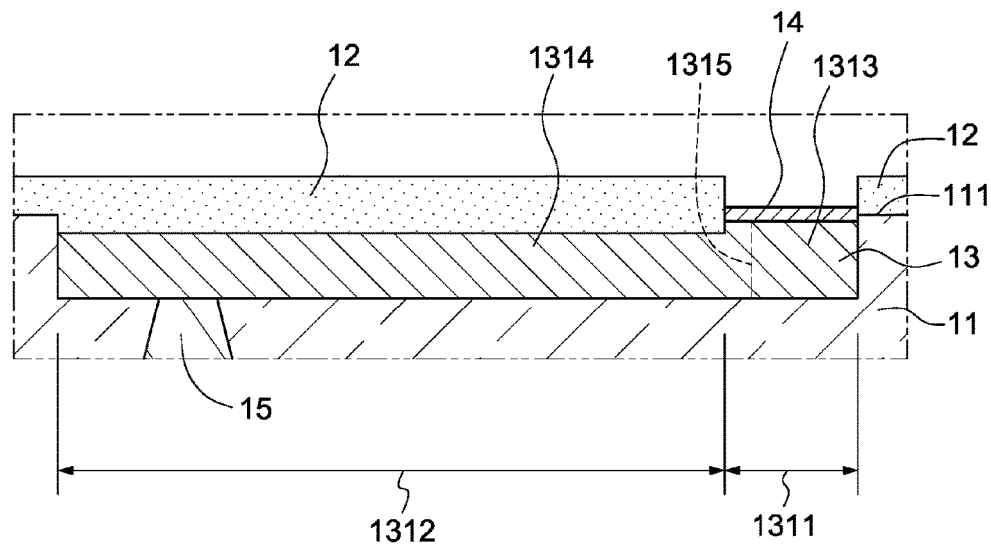

FIG. 1I illustrates an embodiment of the present disclosure, and compared with FIG. 1C, the structure illustrated in FIG. 1I includes a conductive via 15. In FIG. 1I, the upper surface of the surface treatment layer 14 is higher than the first surface 111 of the insulating layer 11, higher than the upper surface of the second portion 1312 of the first conductive circuit layer 13, and lower than the upper surface of the solder resist layer 12; the upper surface of the second portion 1312 is lower than the upper surface of the first portion 1311, and the upper surface of the first portion 1311 is lower than the first surface 111 of the insulating layer 11 and lower than the upper surface of the solder resist layer 12.

Figure 1J:
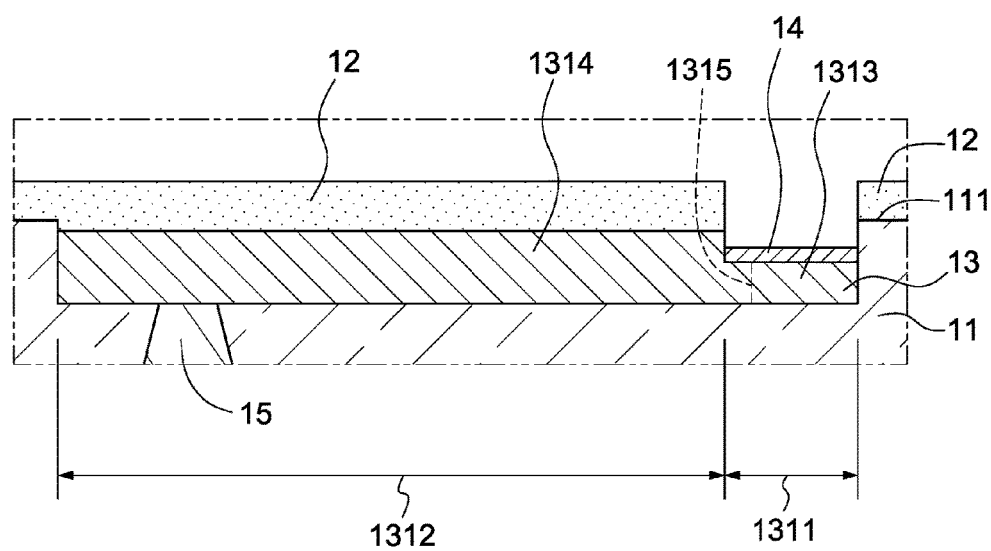

FIG. 1J illustrates an embodiment of the present disclosure, and compared with FIG. 1D, the structure illustrated in FIG. 1J includes a conductive via 15. In FIG. 1J, the upper surface of the surface treatment layer 14 is lower than the first surface 111 of the insulating layer 11, lower than the upper surface of the second portion 1312 of the first conductive circuit layer 13, and lower than the upper surface of the solder resist layer 12; the upper surface of the second portion 1312 is higher than the upper surface of the first portion 1311, and the upper surface of the first portion 1311 is lower than the first surface 111 of the insulating layer 11 and lower than the upper surface of the solder resist layer 12.

Figure 1K:
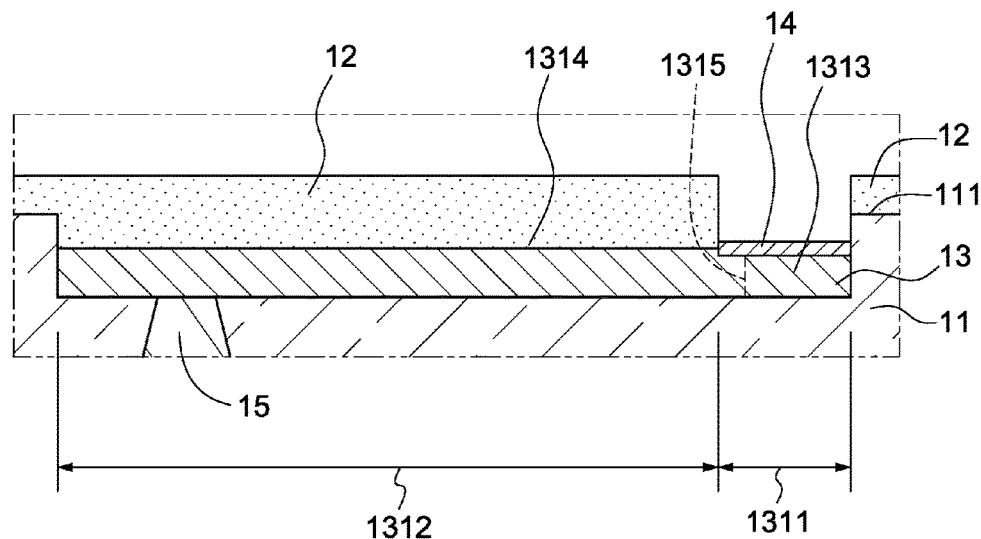

FIG. 1K illustrates an embodiment of the present disclosure, and compared with FIG. 1E, the structure illustrated in FIG. 1K includes a conductive via 15. In FIG. 1K, the upper surface of the surface treatment layer 14 is lower than the first surface 111 of the insulating layer 11, higher than the upper surface of the second portion 1312 of the first conductive circuit layer 13, and lower than the upper surface of the solder resist layer 12; the upper surface of the second portion 1312 is higher than the upper surface of the first portion 1311, and the upper surface of the first portion 1311 is lower than the first surface 111 of the insulating layer 11 and lower than the upper surface of the solder resist layer 12.

Figure 1L:
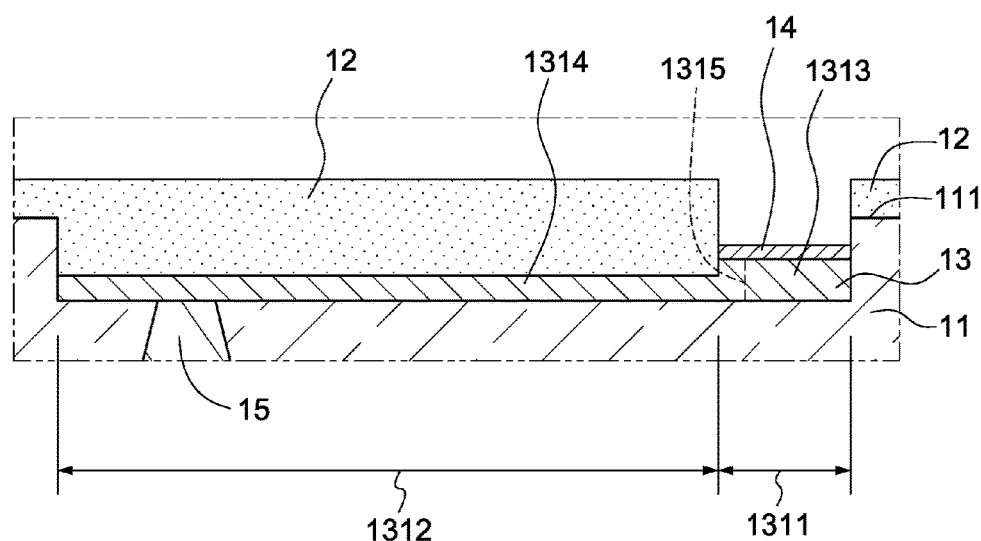

FIG. 1L illustrates an embodiment of the present disclosure, and compared with FIG. 1F, the structure illustrated in FIG. 1L includes a conductive via 15. In FIG. 1L, the upper surface of the surface treatment layer 14 is lower than the first surface 111 of the insulating layer 11, higher than the upper surface of the second portion 1312 of the first conductive circuit layer 13, and lower than the upper surface of the solder resist layer 12; the upper surface of the second portion 1312 is lower than the upper surface of the first portion 1311, and the upper surface of the first portion 1311 is lower than the first surface 111 of the insulating layer 11 and lower than the upper surface of the solder resist layer 12.

As can be seen for the embodiments of FIGS. 1H-1L, the upper surface of the first portion 1311 of the first conductive circuit layer 13 is not coplanar with, or is displaced relative to, the upper surface of the second portion 1312 of the first conductive circuit layer 13.

As can also be seen for the embodiments of FIGS. 1H-1L, the upper surface of the second portion 1312 of the first conductive circuit layer 13 and the upper surface of the first portion 1311 of the first conductive circuit layer 13 are each lower than the first surface 111 of the insulating layer 11.

Figure 2A:
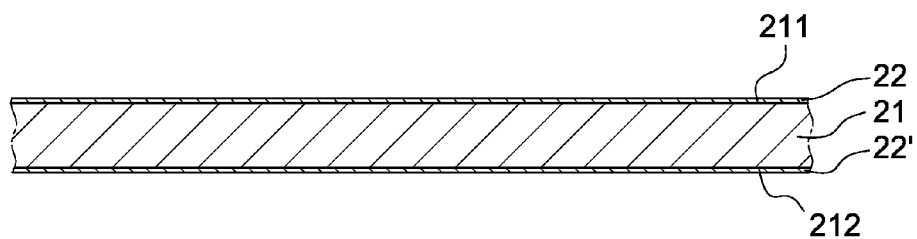
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O, FIG. 2P, FIG. 2Q, FIG. 2R, FIG. 2S, FIG. 2T, FIG. 2U, FIG. 2V, FIG. 2W and FIG. 2X illustrate a manufacturing method of the substrate shown in FIG. 1A.
Figure 2B:
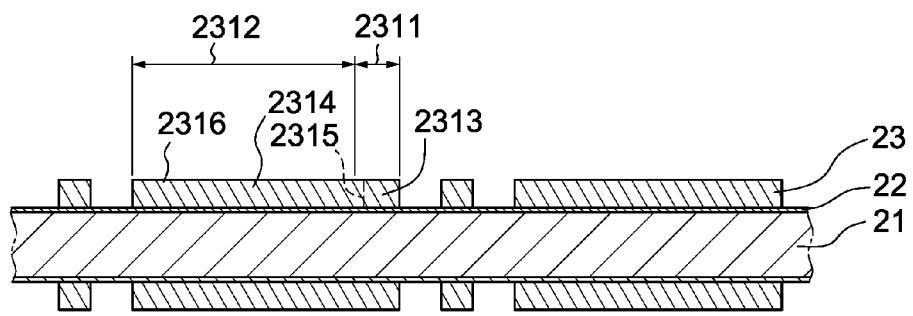
Figure 2C:
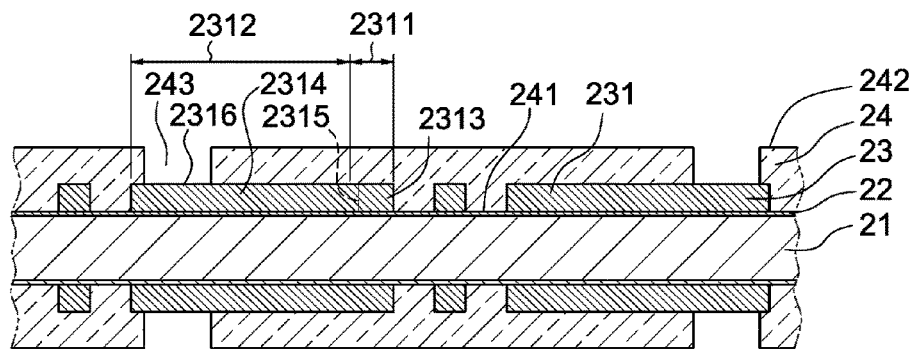
Figure 2D:
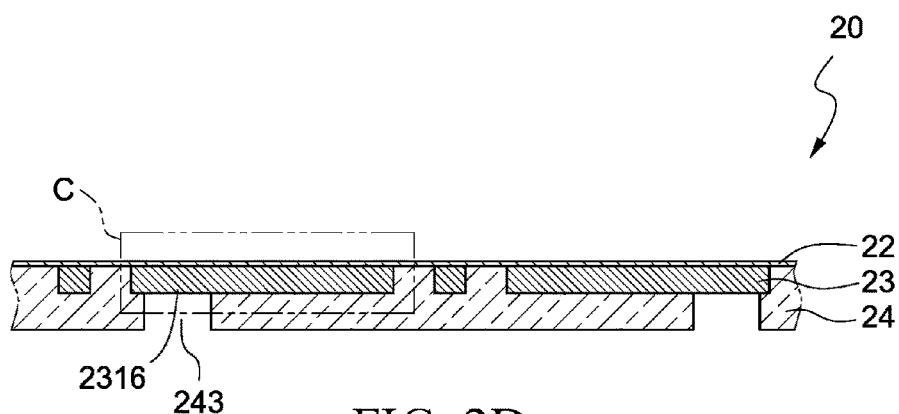
Figure 2E:
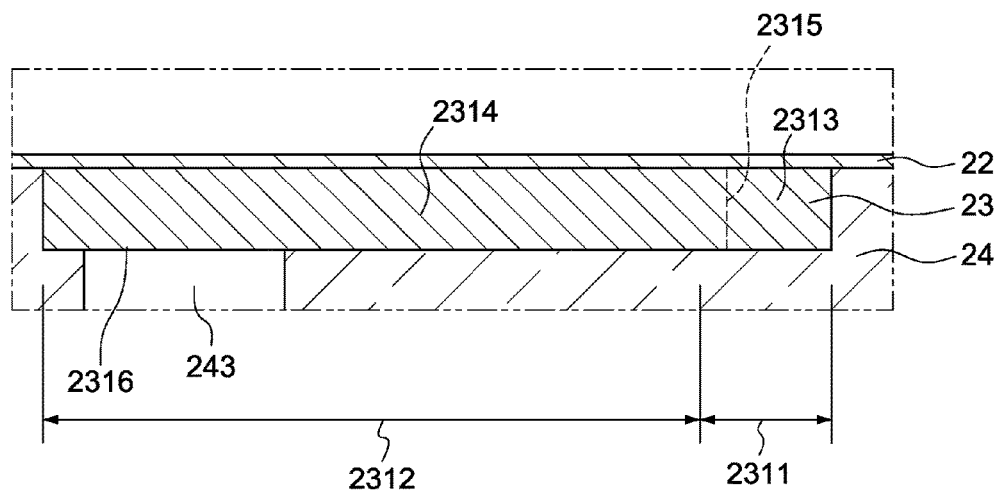
Figure 2F:
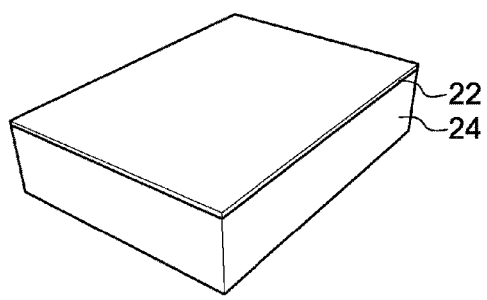
Figure 2G:
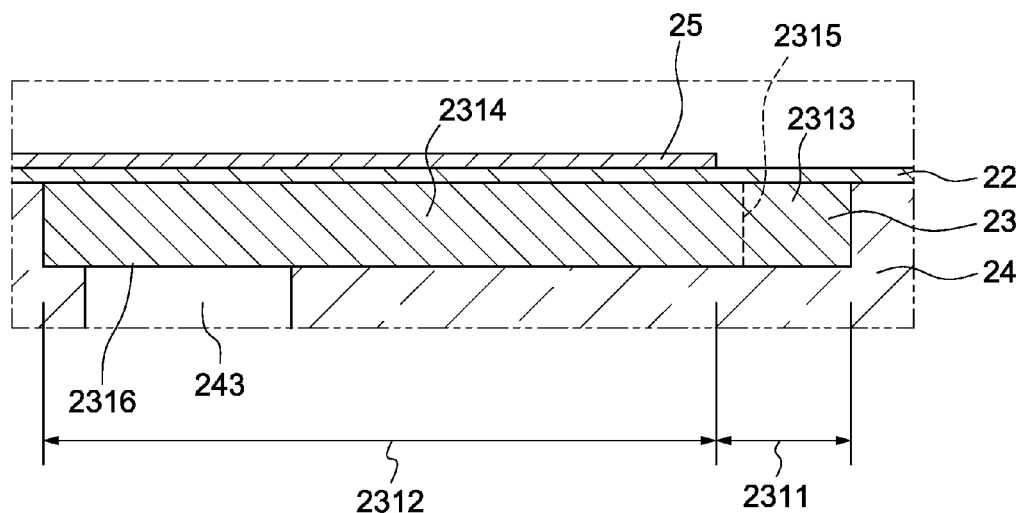
Figure 2H:
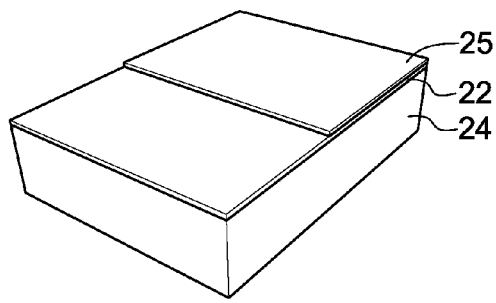
Figure 2I:
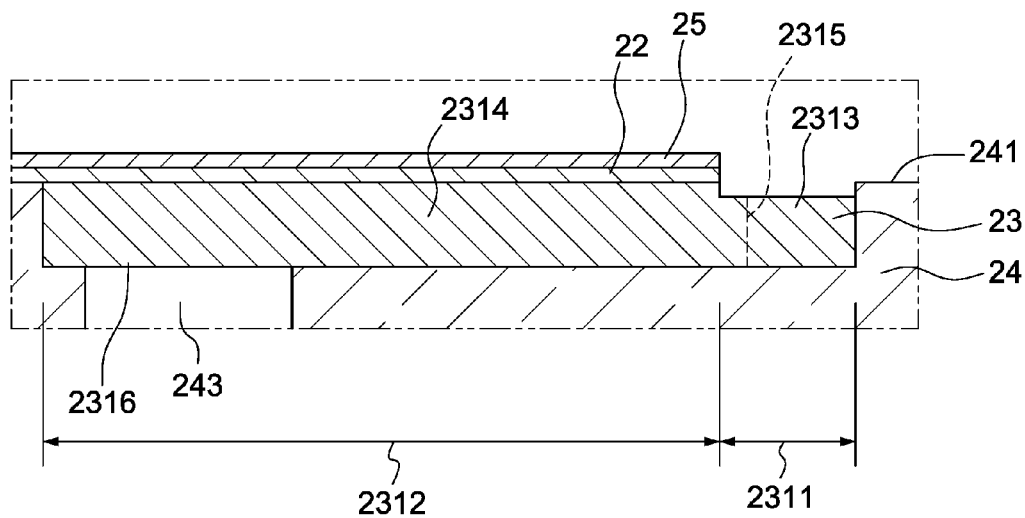
Figure 2J:
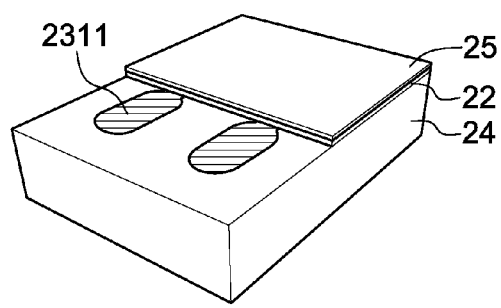
Figure 2K:
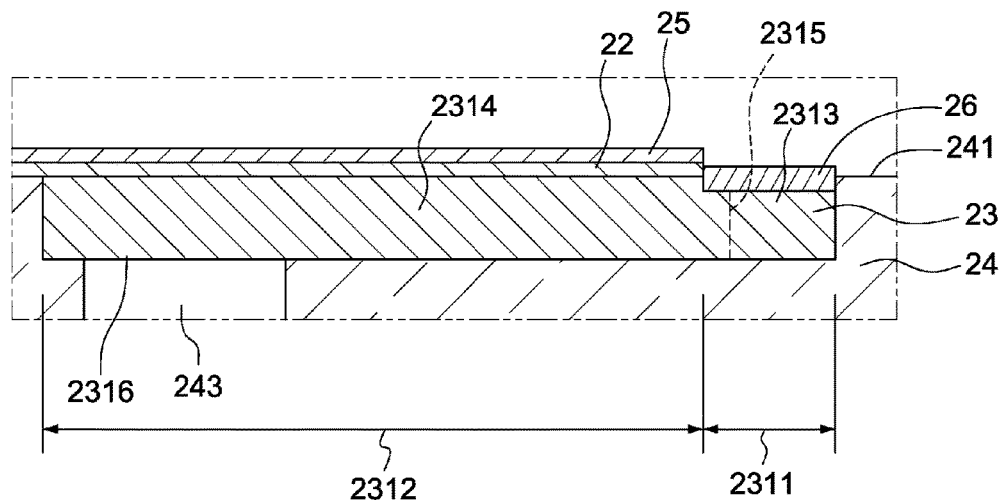
Figure 2L:
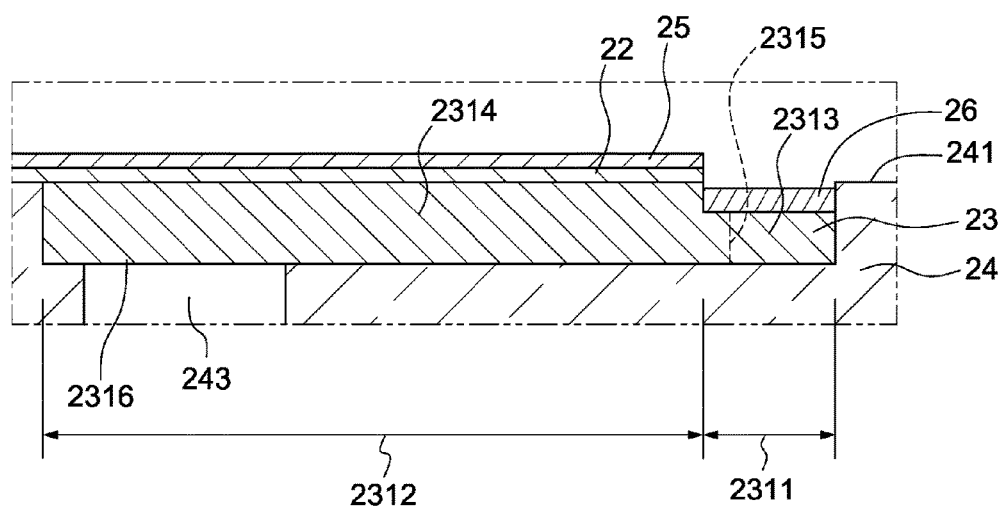
Figure 2M:
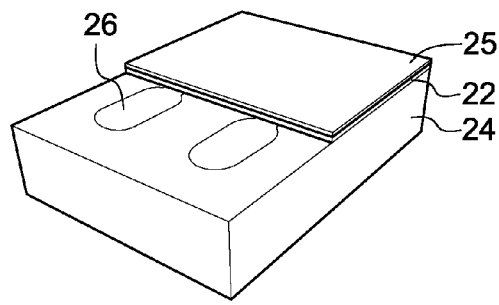
Figure 2N:
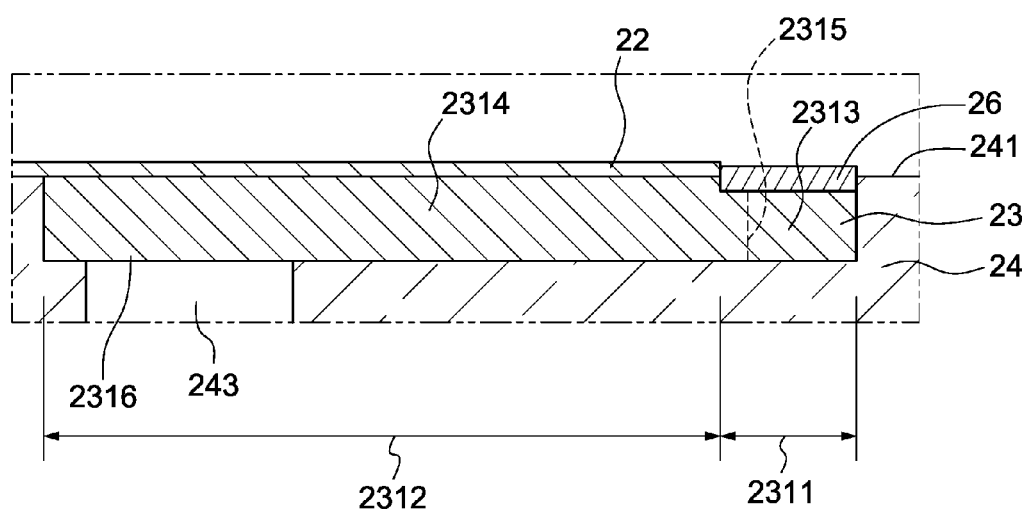
Figure 2O:
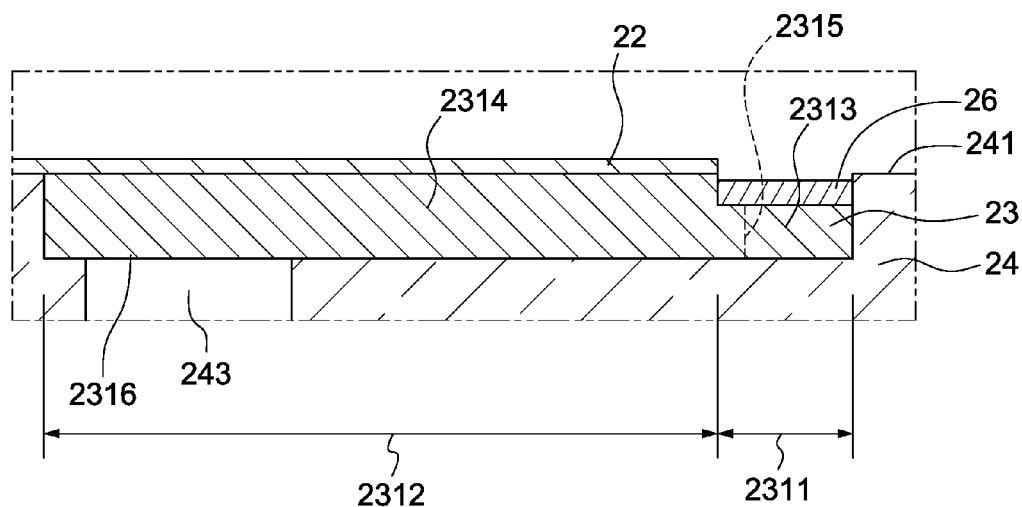
Figure 2P:
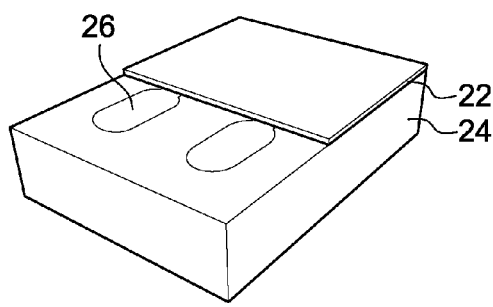
Figure 2Q:
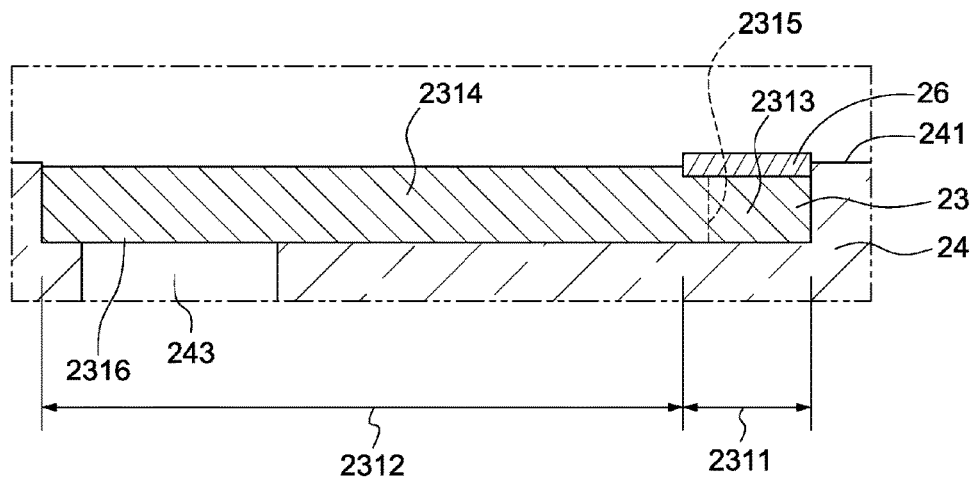
Figure 2R:
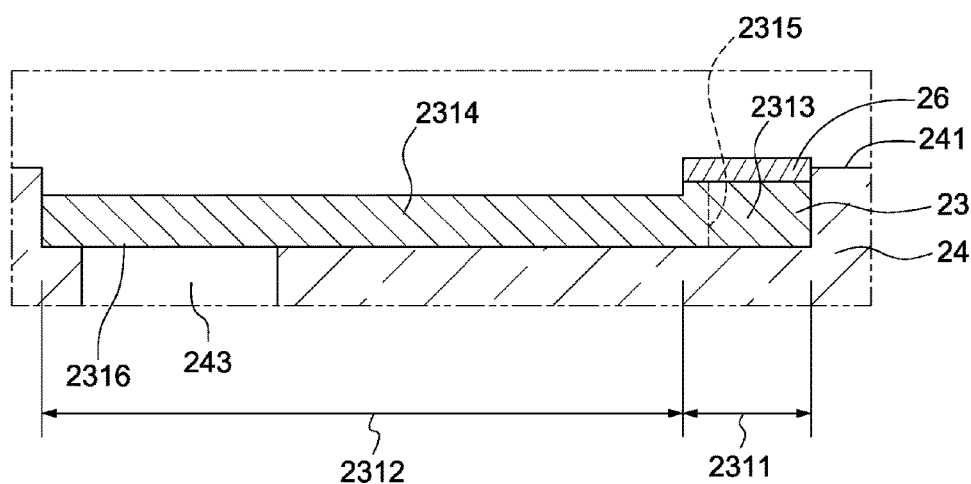
Figure 2S:
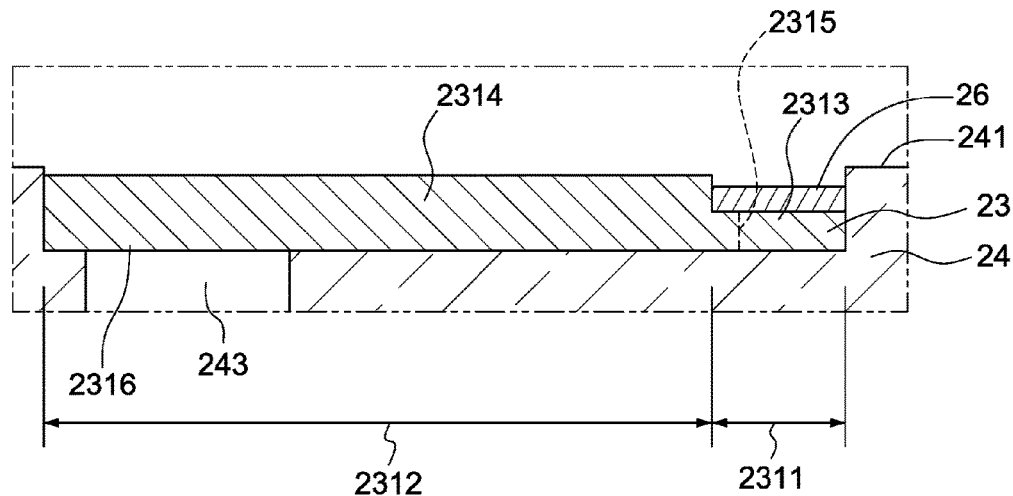
Figure 2T:
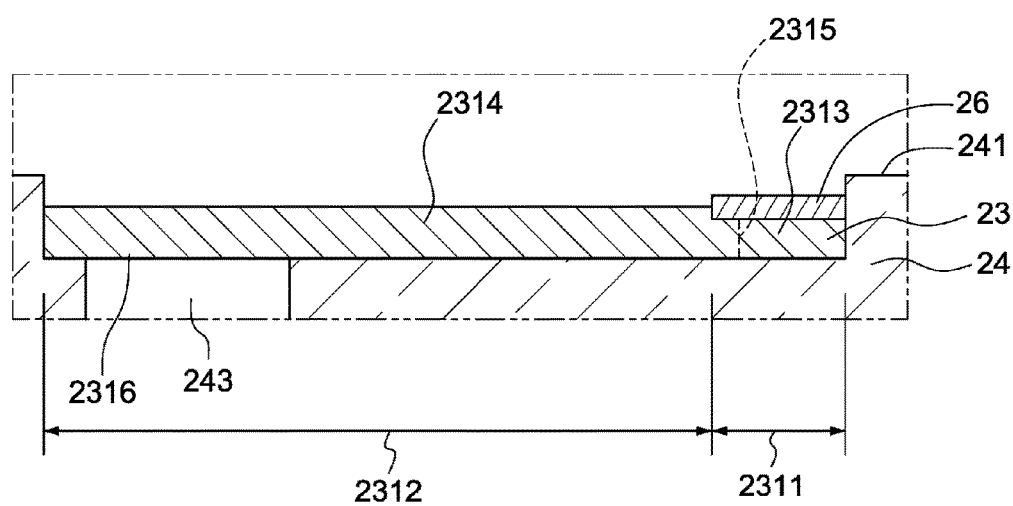
Figure 2U:
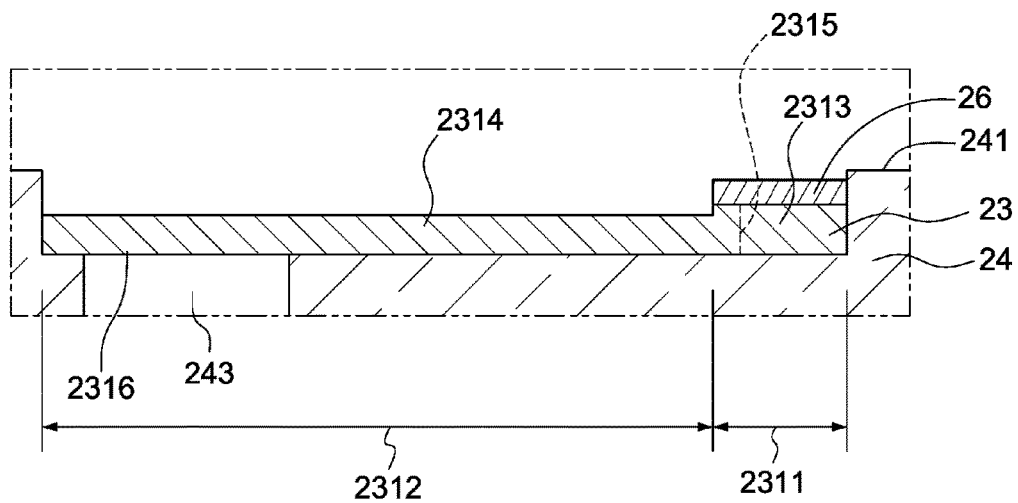
Figure 2V:
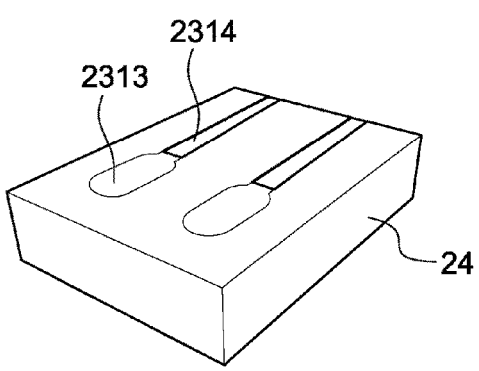
Figure 2W:
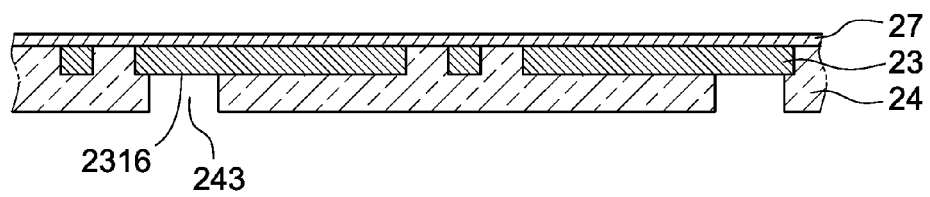
Figure 2X:
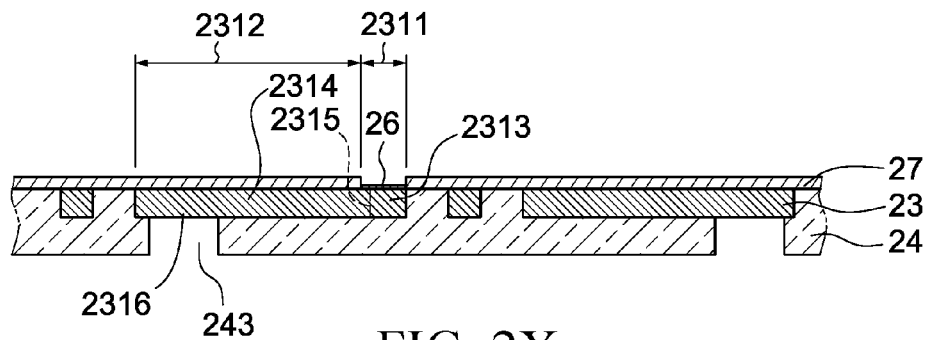

FIGS. 2A-2X illustrate a manufacturing method for the substrate shown in FIG. 1A.

Referring to FIG. 2A, a carrier 21 and a conductive layer 22 are provided, the carrier 21 has a first surface 211 and a second surface 212, and the conductive layer 22 is disposed on the first surface 211 of the carrier 21.

The carrier 21 may include (but is not limited to) a glass-reinforced epoxy laminate (e.g., FR4 with woven glass and epoxy).

The conductive layer 22 has a thickness from about 1 micrometer (μm) to about 18 μm, such as about 1 μm to about 15 μm, about 1 μm to about 10 μm, or about 5 μm to about 10 μm. A conductive thin film can be first prepared and then be attached to the carrier 21 as the conductive layer 22, where attachment may be through (but is not limited to) laminating or bonding. The conductive layer 22 may include (but is not limited to) a metal, such as a copper foil or other metal. In an embodiment, an organic or inorganic release layer (not shown) is applied between the carrier 21 and the conductive layer 22, such that the carrier 21 and the conductive layer 22 can be separated in a subsequent stage. In an embodiment, the conductive layer 22 is part of a composite copper-foil layer, and the composite copper-foil layer includes two layers of copper foil, between which is an organic or inorganic release layer.

The second surface 212 of the carrier 21 further includes a lower conductive layer 22', the lower conductive layer 22' corresponds to the conductive layer 22, and both the conductive layer 22 and the lower conductive layer 22' may be formed in a same or similar manner, and in a same process stage. Thus, two semiconductor substrates can be simultaneously manufactured using one carrier 21. Because of the similarity of the conductive layer 22 and the lower conductive layer 22', the process on the conductive layer 22 is described and a description of the process on the lower conductive layer 22' is omitted.

Referring to FIG. 2B, the conductive layer 22 is used as an electrode to form a first conductive circuit layer 23 on the conductive layer 22. The first conductive circuit layer 23 may be formed using (but is not limited to) photolithography, plating, stripping or other techniques, where photolithography includes film-pressing, exposure and development. The first conductive circuit layer 23 may include (but is not limited to) copper or other metal. The first conductive circuit layer 23 includes a first portion 2311 and a second portion 2312, and the first portion 2311 includes a bonding pad 2313, for example, a conductive finger. The first portion 2311 is integrally formed with the second portion 2312. The first conductive circuit layer 23 includes a conductive trace 2314. The conductive trace 2314 is electrically connected to the conductive layer 22. The first portion 2311 includes the bonding pad 2313 and a part of the conductive trace 2314 (a virtual line 2315 is a separation line between them). The second portion 2312 includes a remainder of the conductive trace 2314 and a solder pad 2316. A minimum line pitch and line width of a circuit formed by the first conductive circuit layer 23 may be about 10 μm to about 20 μm, such as about 10 μm to about 18 μm, about 10 μm to about 15 μm, or about 15 μm to about 20 μm. The first conductive circuit layer 23 has a thickness of about 5 μm to about 20 μm.

Referring to FIG. 2C, an insulating layer 24 is formed to cover the first conductive circuit layer 23 so that the first conductive circuit layer 23 is embedded in the insulating layer 24. The insulating layer 24 includes an insulating material or a dielectric material, for example, solder resist, epoxy woven glass fiber prepreg, PI or Ajinomoto Build-up Film (ABF) resin. The insulating layer 24 is attached to the first circuit layer 23 and the conductive layer 22 by laminating. After laminating, the insulating layer 24 has a first surface 241 and a second surface 242, where the first surface 241 of the insulating layer 24 contacts the conductive layer 22, and the first conductive circuit layer 23 is embedded in the first surface 241 of the insulating layer 24. Next, at least one opening 243 is formed on the second surface 242 of the insulating layer 24 to expose the solder pad 2316. The opening 243 is formed by, for example (but not limited to), laser drilling or exposure and development.

Referring to FIG. 2D and FIG. 2E (FIG. 2E is an enlarged view of a section 'C' shown in dotted line in FIG. 2D), the carrier 21 is removed, such as by stripping, to form a substrate 20 (and also another substrate on the lower conductive layer 22'). For an embodiment in which the conductive layer 22 is part of a composite copper-foil layer including two layers of copper foil and a release layer therebetween, the carrier 21 is removed by separating the two layers of copper foil, and each layer of copper foil becomes part of a separated substrate (conductive layer 22 on substrate 20 and the lower conductive layer 22' on another substrate). The substrate 20 includes the conductive layer 22 over the first conductive circuit layer 23 and the insulating layer 24. The first conductive circuit layer 23 includes the first portion 2311 and the second portion 2312, and the first portion 2311 includes the bonding pad 2313 (wherein a marked line 2315 is a virtual marked line, used for marking a position that separates the bonding pad 2313 from the conductive trace 2314).

FIG. 2F is a perspective view of the section 'C' of FIG. 2D, and it can be understood from FIG. 2E and FIG. 2F that, at this point, the conductive layer 22 completely covers the first conductive circuit layer 23 and the insulating layer 24.

FIGS. 2G-2V illustrate formation of a surface treatment layer on a surface of the first portion 2311 of the first conductive circuit layer 23.

Referring to FIG. 2G and FIG. 2H (a perspective view of a portion of FIG. 2G), a dry film 25 is formed on the conductive layer 22 and exposes the first portion 2311 of the conductive layer 22. The first portion 2311 may be coextensive with the bonding pad 2313; however, in consideration of process alignment tolerances, the first portion 2311 includes, in addition to the bonding pad 2313, a portion of the conductive trace 2314 (the virtual line 2315 is used to indicate a demarcation between the bonding pad 2313 and the conductive trace 2314).

Referring to FIG. 2I and FIG. 2J (a perspective view of FIG. 2I), a portion of the conductive layer 22 exposed by the dry film 25 is removed, for example, by etching. In practice, if the substrate is etched to remove the exposed portion of the conductive layer 22, because an etching agent has different etching capabilities at different positions of the substrate, to ensure that the bonding pad 2313 can be fully exposed to facilitate subsequent related process stages (e.g., plating the surface treatment layer), over-etching may be performed. The over-etching may also result in an upper surface of the first portion 2311 being lower than the first surface 241 of the insulating layer 24 and lower than an upper surface of the second portion 2312, such that the upper surface of the first portion 2311 is not coplanar with the upper surface of the second portion 2312.

After the exposed portion of the conductive layer 22 is removed, the first portion 2311 of the first conductive circuit layer 23 is exposed, that is, an upper surface of the bonding pad 2313 and a portion of an upper surface of the conductive trace 2314 are exposed.

Referring to FIG. 2K, FIG. 2L and FIG. 2M (where FIG. 2M is a perspective view of either FIG. 2K or FIG. 2L), a surface treatment layer 26 is plated on the upper surface of the first portion 2311 of the first conductive circuit layer 23. In an embodiment, the surface treatment layer 26 includes nickel, gold, a combination thereof, or layers thereof. Because the conductive layer 22 has not been fully removed and is exposed above the first portion 2311 of the conductive layer 23, and the conductive layer 22 electrically connects to the first conductive circuit layer 23, the conductive layer 22 can serve as an electrode during plating, to avoid a need for electroplating lines. Because electroplating lines are not needed, a flexibility of the circuit layout may be increased (e.g., circuit density is increased), thereby providing for fine trace pitch.

Depending on how much lower the upper surface of the first portion 2311 is than the upper surface of the second portion 2312, and depending on a thickness of the surface treatment layer 26, an upper surface of the surface treatment layer 26 may be higher than the first surface 241 of the insulating layer 24 (as shown in FIG. 2K), or lower than the first surface 241 of the insulating layer 24 (as shown in FIG. 2L).

Referring to FIG. 2N, FIG. 2O and FIG. 2P (where FIG. 2P is a perspective view of either FIG. 2N or FIG. 2O), the dry film 25 is removed, for example, by stripping, to expose the other part of the conductive layer 22.

Referring to FIGS. 2Q-2U, the remainder of the conductive layer 22 is removed, such as by etching. FIG. 2Q and FIG. 2R follow from FIG. 2N, and FIGS. 2S, 2T and 2U follow from FIG. 2O.

Referring to FIG. 2Q and FIG. 2R, the remainder of the conductive layer 22 of FIG. 2N is removed. After the remainder of the conductive layer 22 is removed, the upper surface of the second portion 2312 of the first conductive circuit layer 23 is exposed. In practice, to ensure that the remainder of the conductive layer 22 is removed completely, over-etching may occur. An area of the conductive layer 22 to be etched when removing the remainder of the conductive layer 22 is greater than an area that was etched in the conductive layer 22 to expose the first portion 2311 of the first conductive circuit layer 23, so that the amount of over-etching may be correspondingly greater. Accordingly, an upper surface of the second portion 2312 may be etched so that it is lower than the upper surface of the surface treatment layer 26 (e.g., FIGS. 2Q and 2R), and may also be lower than the upper surface of the first portion 2311 (e.g., FIG. 2R). Thus, the upper surface of the first portion 2311 and the upper surface of the second portion 2312 have a stage difference (they are not coplanar), and the upper surface of the second portion 2312 is lower than the first surface 241 of the insulating layer 24. For example, the upper surface of the first portion 2311 and the upper surface of the second portion 2312 may be displaced from one another by about 0.05 µm or more, about 0.1 µm or more, or about 0.2 µm or more.

Referring to FIG. 2S, FIG. 2T and FIG. 2U, the remainder of the conductive layer 22 of FIG. 2O is removed. After the remainder of the conductive layer 22 is removed, the upper surface of the second portion 2312 of the first conductive circuit layer 23 is exposed. In practice, to ensure that the remainder of the conductive layer 22 is removed completely, over-etching may occur, as discussed above with respect to FIGS. 2Q and 2R. Accordingly, an upper surface of the second portion 2312 may be etched so that it is higher than the upper surface of the surface treatment layer 26 (e.g., FIG. 2S) or lower than the upper surface of the surface treatment layer 26 (e.g., FIGS. 2T and 2U), and the upper surface of the second portion 2312 may be lower than the upper surface of the first portion 2311 (e.g., FIG. 2U). Thus, the upper surface of the first portion 2311 and the upper surface of the second portion 2312 have a stage difference (they are not coplanar), and the upper surface of the second portion 2312 is lower than the first surface 241 of the insulating layer 24. For example, the upper surface of the first portion 2311 and the upper surface of the second portion 2312 may be displaced from one another by about 0.05 µm or more, about 0.1 µm or more, or about 0.2 µm or more.

Referring to FIG. 2V (a perspective view of any of the structures illustrated in FIGS. 2Q-2U), it can be seen that, subsequent to the stages illustrated in FIGS. 2Q-2U, the conductive layer 22 is fully removed to expose the bonding pad 2313 and the conductive trace 2314.

Referring to FIG. 2W, a solder resist layer 27 is formed, to cover the first conductive circuit layer 23, the surface treatment layer 26, and the insulating layer 24. The solder resist layer 27 may include (but is not limited to) a solder mask, BCB or a PI.

Referring to FIG. 2X, a portion of the solder resist layer 27 is removed to expose the bonding pad 2313 and the surface treatment layer 26 thereon. A semiconductor substrate such as the semiconductor substrate 10 of FIG. 1A is thus formed.

Figure 3A:
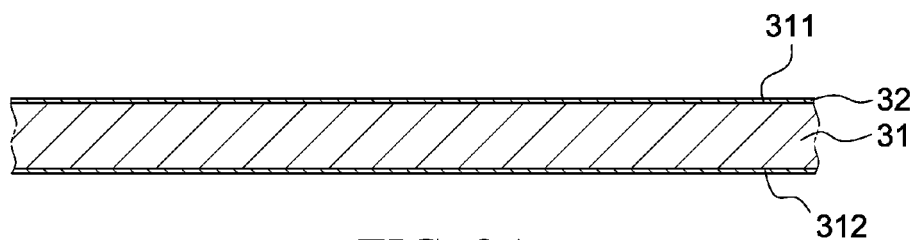
FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L, FIG. 3M, FIG. 3N, FIG. 3O and FIG. 3P illustrate a manufacturing method of the substrate shown in FIG. 1G.
Figure 3B:
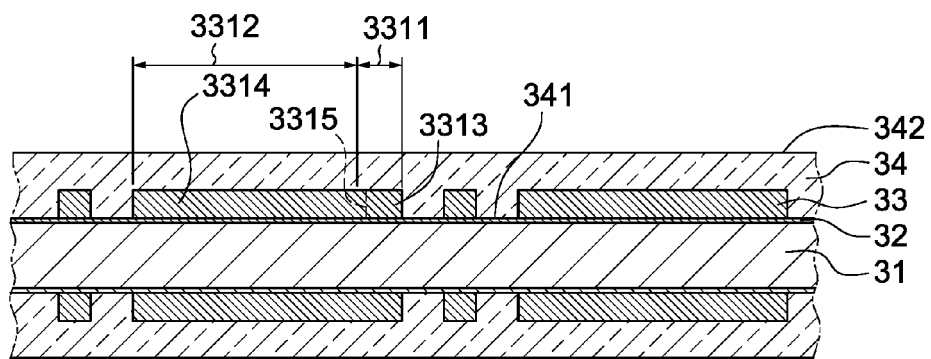
Figure 3C:
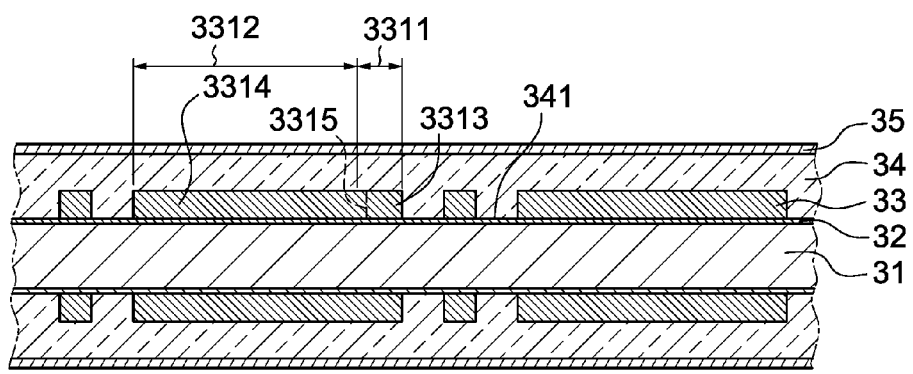
Figure 3D:
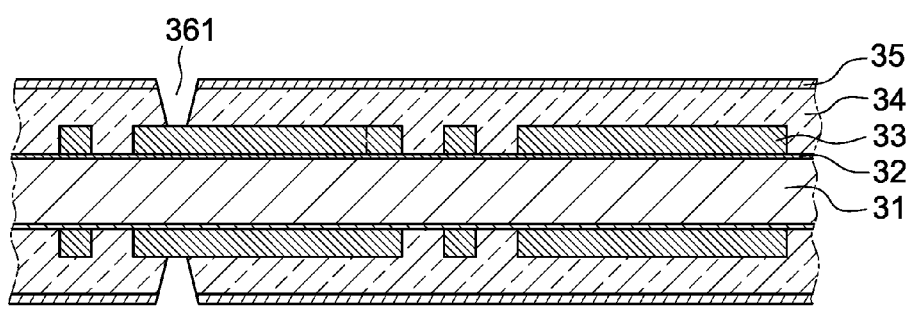
Figure 3E:
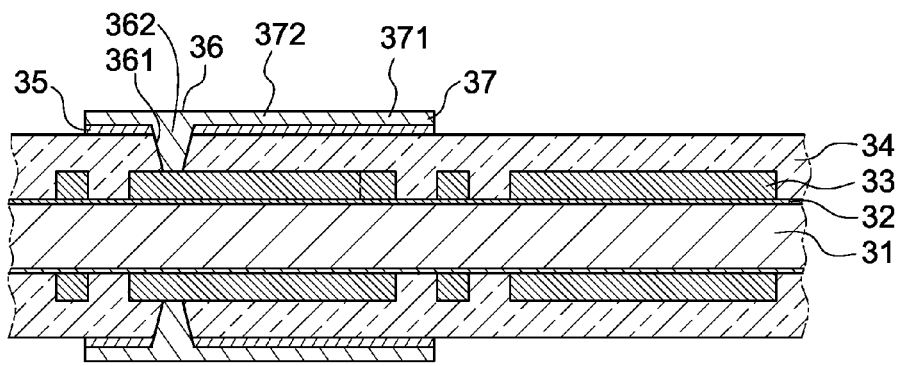
Figure 3F:
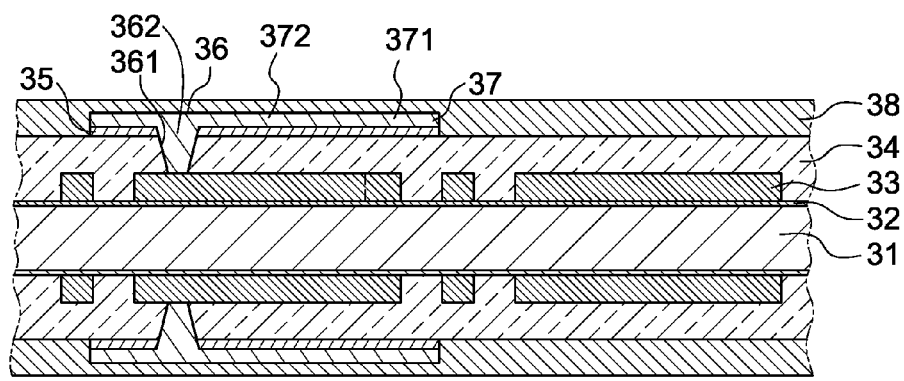
Figure 3G:
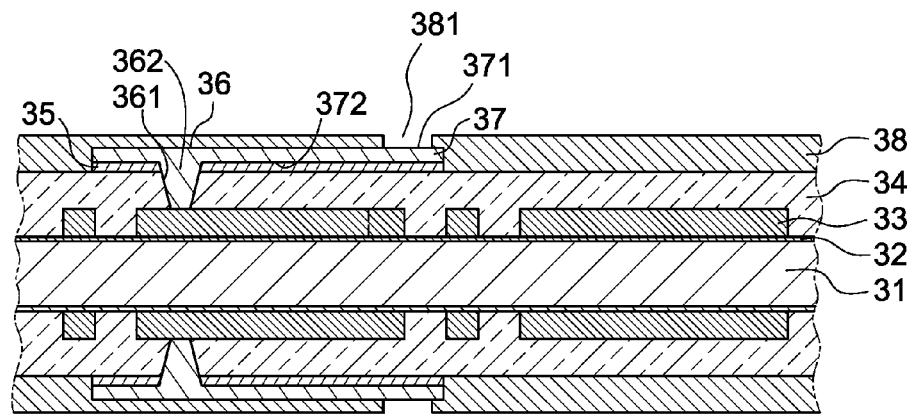
Figure 3H:
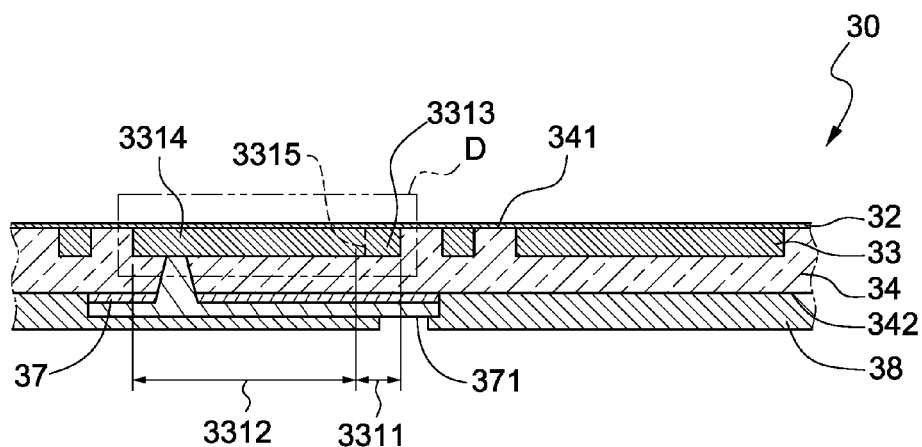
Figure 3I:
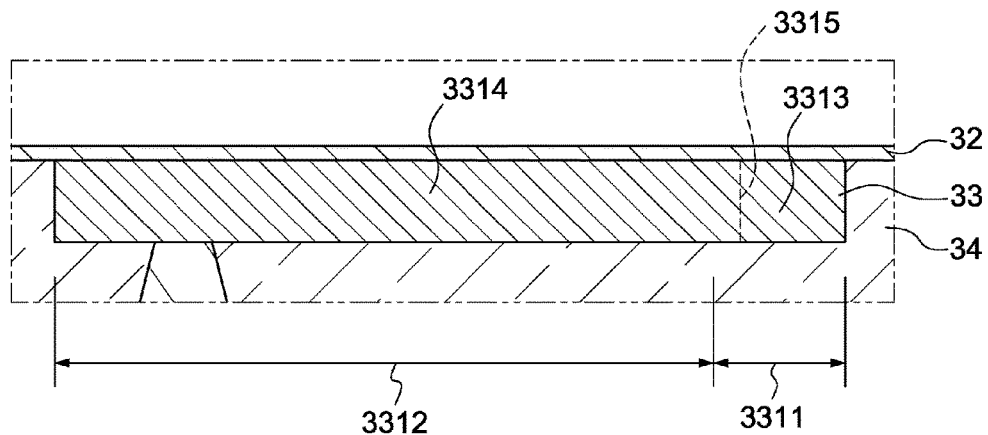
Figure 3J:
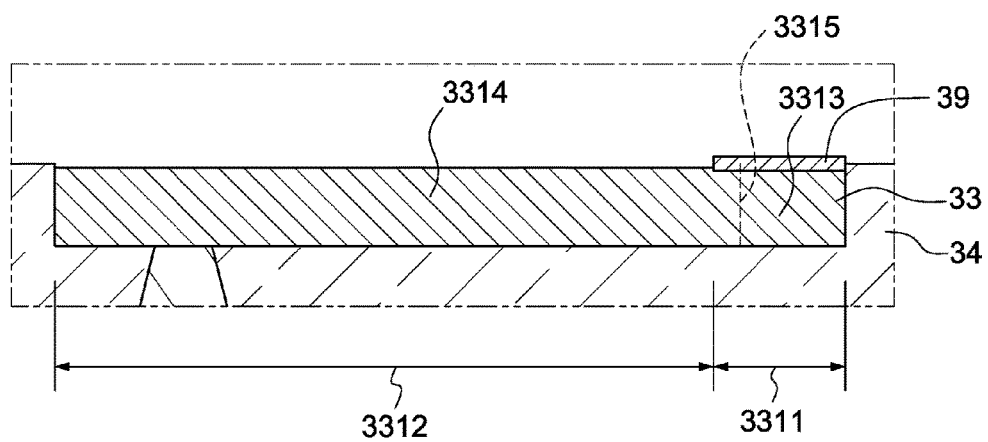
Figure 3K:
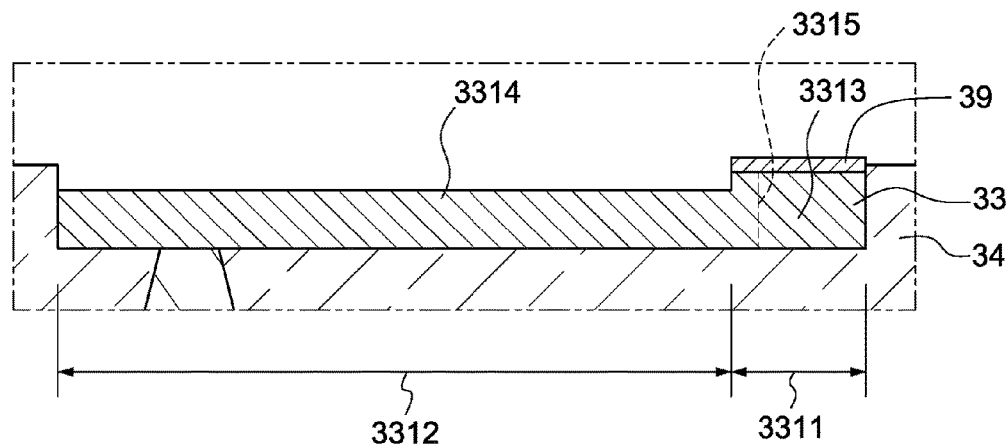
Figure 3L:
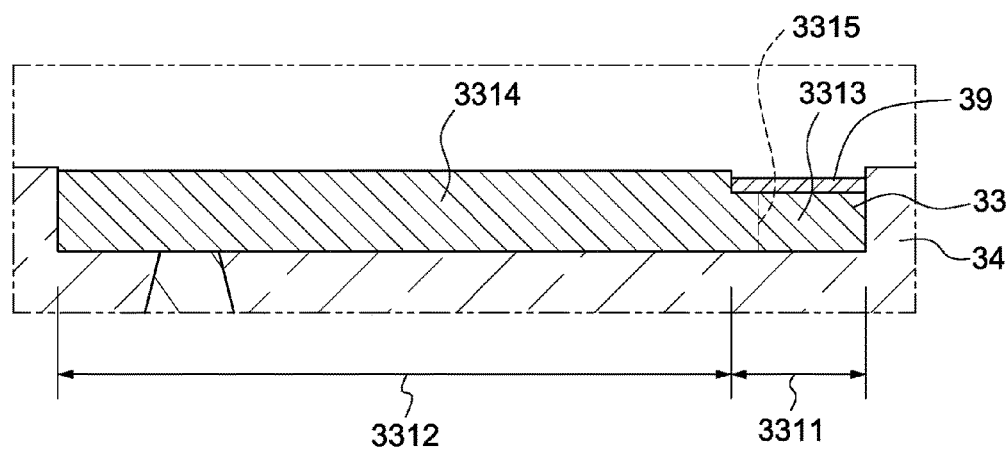
Figure 3M:
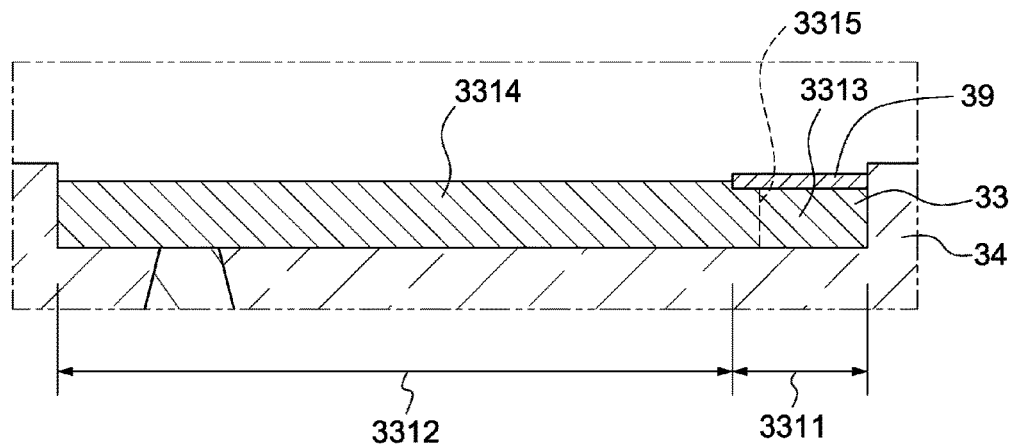
Figure 3N:
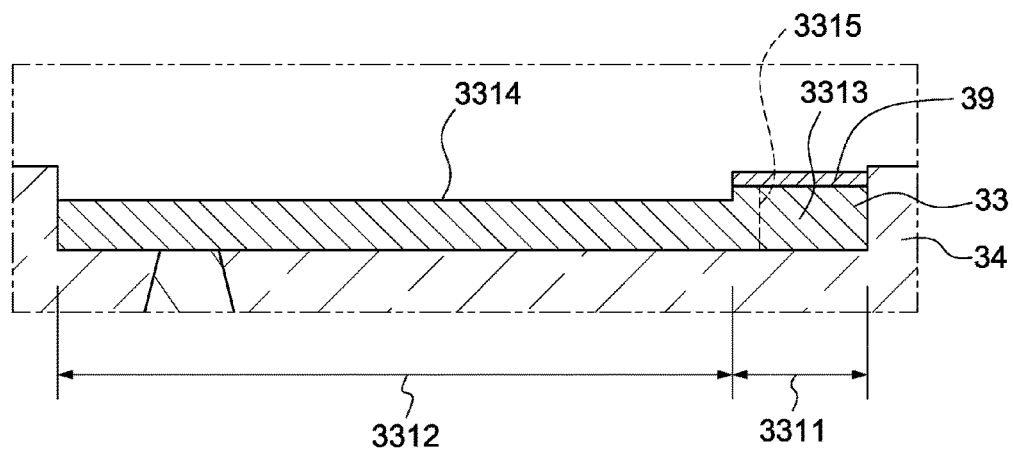
Figure 3O:
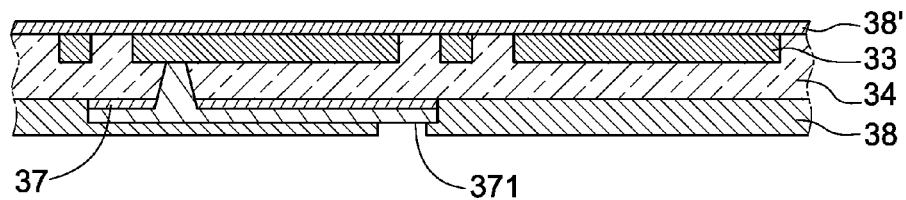
Figure 3P:
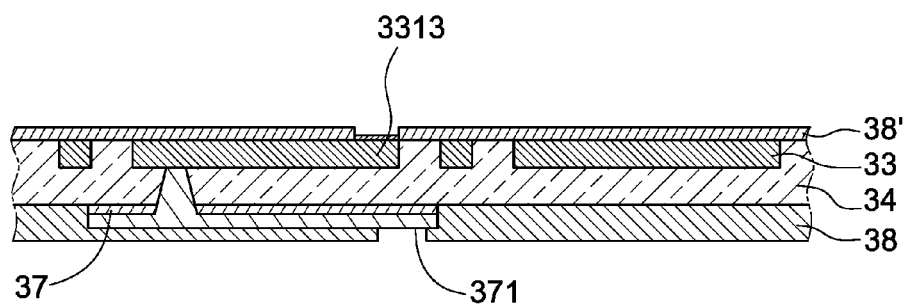

FIGS. 3A-3P illustrate a manufacturing method for the substrate shown in FIG. 1G.

Referring to FIG. 3A, a carrier 31 and a conductive layer 32 are provided, the carrier 31 has a first surface 311 and a second surface 312, and the conductive layer 32 is disposed on the first surface 311 of the carrier 31. The carrier 31 may include (but is not limited to) a glass-reinforced epoxy laminate (e.g., FR4 with woven glass and epoxy).

The conductive layer 32 has a thickness from about 1 μm to about 18 μm, such as about 1 μm to about 15 μm, about 1 μm to about 10 μm, or about 5 μm to about 10 μm. A conductive thin film can be first prepared and then be attached to the carrier 31 as the conductive layer 32, where attachment may be through (but is not limited to) laminating or bonding. The conductive layer 32 may include (but is not limited to) a metal, such as a copper foil or other metal. In an embodiment, an organic or inorganic release layer (not shown) is applied between the carrier 31 and the conductive layer 32, such that the carrier 31 and the conductive layer 32 can be separated in a subsequent stage. In an embodiment, the conductive layer 32 is part of a composite copper-foil layer, and the composite copper-foil layer includes two layers of copper foil, between which is an organic or inorganic release layer.

The second surface 312 of the carrier 31 further includes a lower conductive layer, the lower conductive layer corresponds to the conductive layer 32, and both the conductive layer 32 and the lower conductive layer may be formed in a same or similar manner, and in a same process stage. Thus, two semiconductor substrates can be simultaneously manufactured using one carrier 31. Because of the similarity of the conductive layer 32 and the lower conductive layer, the process on the conductive layer 32 is described and a description of the process on the lower conductive layer is omitted.

Referring to FIG. 3B, the conductive layer 32 is used as an electrode to form a first conductive circuit layer 33 on the conductive layer 32. The first conductive circuit layer 33 may be formed using (but is not limited to) photolithography, plating, stripping or other techniques, where photolithography includes film-pressing, exposure and development. The first conductive circuit layer 33 may include (but is not limited to) copper or other metal. The first conductive circuit layer 33 includes a first portion 3311 and a second portion 3312, and the first portion 3311 includes a bonding pad 3313, for example, a conductive finger. The first portion 3311 is integrally formed with the second portion 3312. The first conductive circuit layer 33 includes a conductive trace 3314. The conductive trace 3314 is electrically connected to the conductive layer 32. The first portion 3311 includes the bonding pad 3313 and a part of the conductive trace 3314 (a virtual line 3315 is a separation line between them). The second portion 3312 includes a remainder of the conductive trace 3314. A minimum line pitch and line width of a circuit formed by the first conductive circuit layer 33 may be about 10 μm to about 20 μm, such as about 10 μm to about 18 μm, about 10 μm to about 15 μm, or about 15 μm to about 20 μm. The first conductive circuit layer 33 has a thickness of about 5 μm to about 20 μm.

Next, an insulating layer 34 is formed to cover the first conductive circuit layer 33 so that the first conductive circuit layer 33 is embedded in the insulating layer 34. The insulating layer 34 includes an insulating material or a dielectric material, for example, solder resist, epoxy woven glass fiber prepreg, PI or Ajinomoto Build-up Film (ABF) resin. The insulating layer 34 is attached to the first circuit layer 33 and the conductive layer 32 by laminating. After laminating, the insulating layer 34 has a first surface 341 and a second surface 342, where the first surface 341 of the insulating layer 34 contacts the conductive layer 32, and the first conductive circuit layer 33 is embedded in the first surface 341 of the insulating layer 34.

In an embodiment of the present disclosure, the insulating layer 34 includes a liquid resin, and the liquid resin may be coated on surfaces of the conductive layer 32 and the first conductive circuit layer 33 to form the insulating layer 34 (with subsequent drying or curing).

Referring to FIG. 3C, a second conductive layer 35 is formed on the insulating layer 34. The second conductive layer 35 may include (but is not limited to) a metal, for example, copper.

Referring to FIG. 3D, one or more holes 361 are formed in the insulating layer 34. The hole 361 penetrates through the second conductive layer 35 to expose a portion of the first conductive circuit layer 33. The hole 361 may be formed by (but is not limited to) laser drilling.

Referring to FIG. 3E, the hole 361 is filled with a conductive material 362 to form a conductive via 36. In an embodiment, the conductive material 362 and a material of the second conductive layer 35 are the same. The conductive material 362 covers a portion of the second conductive layer 35 to form a second conductive circuit layer 37, and portions of the second conductive layer 35 are subsequently removed. The second conductive circuit layer 37 includes one or more solder pads 371 and one or more conductive traces 372.

Referring to FIG. 3F, a solder resist layer 38 is formed to cover the second conductive circuit layer 37 and the insulating layer 34. The solder resist layer 38 may include (but is not limited to) a solder mask, BCB or a PI.

Referring to FIG. 3G, a portion of the solder resist layer 38 is removed to form an opening 381 to expose the solder pad 371.

Referring to FIG. 3H and FIG. 3I (an enlarged view of a section 'D' shown in dotted line in FIG. 3H), the carrier 31 is removed, such as by stripping, to form a substrate 30. (As discussed above, a second substrate is also formed when the carrier 31 is removed). For an embodiment in which the conductive layer 32 is part of a composite copper-foil layer including two layers of copper foil and a release layer therebetween, the carrier 31 is removed by separating the two layers of copper foil, and each layer of copper foil becomes part of a separated substrate. The carrier 30 includes the conductive layer 32 on the first conductive circuit layer 33 and the first surface 341 of the insulating layer 34, and the second conductive circuit layer 37 on the second surface 342 of the insulating layer 34. The first conductive circuit layer 33 includes the first portion 3311 and the second portion 3312, and the first portion 3311 includes the bonding pad 3313 (a virtual line 3315 is used to indicate a demarcation between the bonding pad 3313 and the conductive trace 3314).

Following removal of the carrier 31, a surface treatment layer 39 is formed on the first portion 3311, in a manner similar to the manner of forming the surface treatment layer 26 illustrated and described with respect to FIGS. 2G-2P (e.g., forming a dry film layer, etching the conductive layer 32, forming the surface treatment layer 39, and removing the dry film layer) followed by removing the conductive layer 32.

FIGS. 3J-3N are enlarged views of the section 'D' of FIG. 3H after forming the surface treatment layer 39 and after removal of the conductive layer 32. As discussed above, over-etching may be performed when defining the first portion 3311, and also when removing the conductive layer 32, and a duration of etching at each of the two stages defines relationships between an upper surface of the surface treatment layer 39, an upper surface of the second portion 3312, and an upper surface of the first portion 3331. Examples of such relationships are illustrated and described with respect to FIGS. 3J-3N.

Referring to FIG. 3J, in an embodiment of the present disclosure, an upper surface of the surface treatment layer 39 is higher than the first surface 341 of the insulating layer 34, and higher than the upper surface of the second portion 3312 of the first conductive circuit layer 33; the upper surface of the second portion 3312 is higher than an upper surface of the first portion 3311, and the upper surface of the first portion 3311 is lower than the first surface 341 of the insulating layer 34. For example, the upper surface of the first portion 3311 and the upper surface of the second portion 3312 may be displaced from one another by about 0.05 µm or more, about 0.1 µm or more, or about 0.2 µm or more.

Referring to FIG. 3K, in an embodiment of the present disclosure, the upper surface of the surface treatment layer 39 is higher than the first surface 341 of the insulating layer 34, and higher than the upper surface of the second portion 3312 of the first conductive circuit layer 33; the upper surface of the second portion 3312 is lower than the upper surface of the first portion 3311, and the upper surface of the first portion 3311 is lower than the first surface 341 of the insulating layer 34. For example, the upper surface of the first portion 3311 and the upper surface of the second portion 3312 may be displaced from one another by about 0.05 µm or more, about 0.1 µm or more, or about 0.2 µm or more.

Referring to FIG. 3L, in an embodiment of the present disclosure, the upper surface of the surface treatment layer 39 is lower than the first surface 341 of the insulating layer 34, and lower than the upper surface of the second portion 3312 of the first conductive circuit layer 33; the upper surface of the second portion 3312 is higher than the upper surface of the first portion 3311, and the upper surface of the first portion 3311 is lower than the first surface 341 of the insulating layer 34. For example, the upper surface of the first portion 3311 and the upper surface of the second portion 3312 may be displaced from one another by about 0.05 µm or more, about 0.1 µm or more, or about 0.2 µm or more.

Referring to FIG. 3M, in an embodiment of the present disclosure, the upper surface of the surface treatment layer 39 is lower than the first surface 341 of the insulating layer 34, and higher than the upper surface of the second portion 3312 of the first conductive circuit layer 33; the upper surface of the second portion 3312 is higher than the upper surface of the first portion 3311, and the upper surface of the first portion 3311 is lower than the first surface 341 of the insulating layer 34. For example, the upper surface of the first portion 3311 and the upper surface of the second portion 3312 may be displaced from one another by about 0.05 µm or more, about 0.1 µm or more, or about 0.2 µm or more.

Referring to FIG. 3N, in an embodiment of the present disclosure, the upper surface of the surface treatment layer 39 is lower than the first surface 341 of the insulating layer 34, and higher than the upper surface of the second portion 3312 of the first conductive circuit layer 33; the upper surface of the second portion 3312 is lower than the upper surface of the first portion 3311, and the upper surface of the first portion 3311 is lower than the first surface 341 of the insulating layer 34. For example, the upper surface of the first portion 3311 and the upper surface of the second portion 3312 may be displaced from one another by about 0.05 µm or more, about 0.1 µm or more, or about 0.2 µm or more.

Referring to FIG. 3O, a solder resist layer 38' is formed to cover the first conductive circuit layer 33, the surface treatment layer 39 on the first portion 3311, and the insulating layer 34. The solder resist layer 38' may include (but is not limited to) a solder mask, BCB and a PI.

Referring to FIG. 3P, a portion of the solder resist layer 38' is removed to expose the bonding pad 3313 with the surface treatment layer 39 thereon. A semiconductor substrate such as the semiconductor substrate 10' of FIG. 1G is thus formed.

Figure 4:
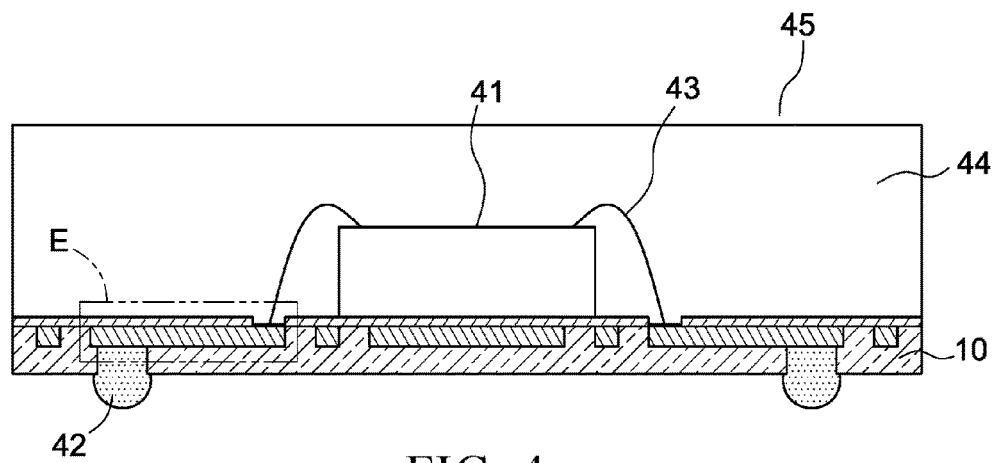
FIG. 4 is an illustration of a semiconductor packaging structure according to an embodiment of the present disclosure.

FIG. 4 illustrates a semiconductor packaging structure 45 according to an embodiment of the present disclosure. The packaging structure 45 includes a die 41, one or more solder balls 42, the semiconductor substrate 10 of FIG. 1A, and an encapsulant 44. One or more bonding wires 43 can be used to electrically connect the die 41 and the semiconductor substrate 10.

A section 'E' shown in dotted line in FIG. 4 may be implemented is as shown in one of the embodiments of FIG. 1B-1F.

Figure 5:
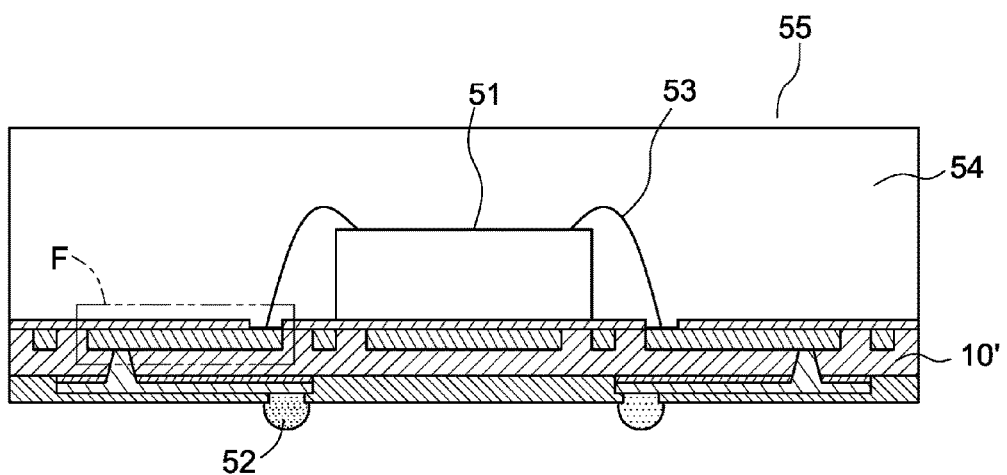
FIG. 5 is an illustration of a semiconductor packaging structure according to an embodiment of the present disclosure.

FIG. 5 illustrates a semiconductor packaging structure 55 according to an embodiment of the present disclosure. The packaging structure 55 includes a die 51, one or more solder balls 52, the semiconductor substrate 10' of FIG. 1G, and an encapsulant 54. One or more bonding wires 53 can be used to electrically connect the die 51 and the semiconductor substrate 10'.

A section 'F' shown in dotted line in FIG. 5 may be implemented is as shown in one of the embodiments of FIG. 1H-1L.

In sum, some embodiments of the present disclosure proposes a semiconductor substrate and a manufacturing method thereof, and a semiconductor packaging structure including the substrate, and particularly, relates to a semiconductor substrate with electroless plating lead design and a manufacturing method thereof, wherein the present disclosure uses a conductive layer in the process, and thus a plated lead can be omitted, thereby achieving the electroless plating lead design, to effectively increase flexibility of circuit layout and circuit design on the substrate and reduce the difficulty of circuit design, to thus achieve a demand for fine pitch.

As used herein, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor substrate, comprising:
    an insulating layer; and
    a first conductive circuit layer embedded at a first surface of the insulating layer, the first conductive circuit layer having an upper surface and comprising a first portion and a second portion, the first portion comprising a bonding pad and one portion of a conductive trace and the second portion comprising another portion of the conductive trace, wherein an upper surface of the first portion is not coplanar with an upper surface of the second portion,
    and wherein the bonding pad is lower than the first surface of the insulating layer, and the entire upper surface of the first conductive circuit layer is exposed from the insulating layer.

2. The semiconductor substrate according to claim 1, further comprising a surface treatment layer disposed on the first portion of the first conductive layer exposed by the insulating layer, the surface treatment layer covering an upper surface of the bonding pad.

3. The semiconductor substrate according to claim 2, further comprising a solder resist layer disposed over the first surface of the insulating layer and the first conductive circuit layer, the solder resist layer exposing the surface treatment layer.

4. The semiconductor substrate according to claim 1, wherein the upper surface of the second portion is lower than the first surface of the insulating layer.

5. The semiconductor substrate according to claim 4, wherein the upper surface of the first portion is lower than the first surface of the insulating layer.

6. The semiconductor substrate according to claim 1, wherein the upper surface of the first portion is higher than the upper surface of the second portion.

7. The semiconductor substrate according to claim 1, wherein the upper surface of the first portion is lower than the upper surface of the second portion.

8. The semiconductor substrate according to claim 1, wherein the first conductive circuit layer is recessed from the first surface of the insulating layer.

9. The semiconductor substrate according to claim 1, wherein the insulating layer defines an opening to expose the second portion.

10. The semiconductor substrate according to claim 1, further comprising a second conductive circuit layer disposed on a second surface of the insulating layer and electrically connected to the first conductive circuit layer.

11. A semiconductor packaging structure, comprising:
    a substrate, the substrate comprising:
    an insulating layer; and
    a first conductive circuit layer adjacent to a first surface of the insulating layer, the first conductive circuit layer comprising a first portion and a second portion, the first portion comprising a bonding pad, an upper surface of the first portion is displaced relative to an upper surface of the second portion, and wherein the bonding pad is lower than the first surface of the insulating layer, and the entire upper surface of the second portion of the first conductive circuit layer is exposed from the first surface of the insulating layer;
    a die electrically connecting to the bonding pad; and
    an encapsulant covering the die and the bonding pad.

12. The semiconductor packaging structure according to claim 11, further comprising a surface treatment layer disposed on the bonding pad.

13. The semiconductor packaging structure according to claim 11, wherein the surface of the first portion is higher than the surface of the second portion.

14. The semiconductor packaging structure according to claim 11, wherein the upper surface of the first portion is lower than the upper surface of the second portion.

15. The semiconductor packaging structure according to claim 11, wherein the insulating layer defines an opening to expose the second portion.

16. The semiconductor packaging structure according to claim 11, further comprising a second conductive circuit layer disposed on a second surface of the insulating layer and electrically connected to the first conductive circuit layer.

17. A semiconductor packaging structure, comprising:
    a substrate comprising:
    an insulating layer;
    a conductive trace embedded adjacent to a first surface of the insulating layer, the conductive trace having an upper surface and comprising a first portion and a second portion, the first portion comprising a bonding pad, and wherein the entire upper surface of the conductive trace is exposed from the first surface of the insulating layer;
    a conductive circuit layer disposed on a second surface of the insulating layer; and
    a via that traverses the insulating layer and electrically connects the conductive trace and the conductive circuit layer;
    wherein an upper surface of the first portion is not coplanar with an upper surface of the second portion, and
    wherein the bonding pad is lower than the first surface of the insulating layer.

18. The semiconductor packaging structure according to claim 17, further comprising a solder resist layer disposed on the second surface of the insulating layer and on the conductive circuit layer.

19. The semiconductor packaging structure according to claim 18, wherein the conductive circuit layer comprises a solder pad, and the solder resist layer defines an opening that exposes the solder pad.

20. The semiconductor packaging structure according to claim 19, wherein the upper surface of the first portion is lower than the upper surface of the second portion.

\* \* \* \* \*